US008446079B2

(12) United States Patent
Fang et al.

(10) Patent No.: US 8,446,079 B2
(45) Date of Patent: May 21, 2013

(54) PIEZOELECTRIC RESONATOR WITH VIBRATION ISOLATION

(75) Inventors: Yue Fang, Brea, CA (US); Shih Chuang, Irvine, CA (US)

(73) Assignee: Statek Corporation, Orange, CA (US)

( * ) Notice: Subject to any disclaimer, the term of this patent is extended or adjusted under 35 U.S.C. 154(b) by 336 days.

(21) Appl. No.: 12/471,084

(22) Filed: May 22, 2009

(65) Prior Publication Data
US 2009/0289531 A1 Nov. 26, 2009

Related U.S. Application Data

(60) Provisional application No. 61/055,927, filed on May 23, 2008.

(51) Int. Cl.
*H03H 9/19* (2006.01)
*H03H 9/21* (2006.01)
(52) U.S. Cl.
USPC .......................................................... 310/370
(58) Field of Classification Search
USPC .......................................................... 310/370
See application file for complete search history.

(56) References Cited

U.S. PATENT DOCUMENTS

| 3,423,700 | A | 1/1969 | Curran et al. |
|---|---|---|---|
| 3,576,453 | A | 4/1971 | Mason |
| 3,683,213 | A | 8/1972 | Staudie |
| 3,697,766 | A | 10/1972 | Ganter et al. |
| 3,766,616 | A | 10/1973 | Staudte |
| 3,969,640 | A | 7/1976 | Staudte |
| 4,099,078 | A | 7/1978 | Shibato et al. |
| 4,178,566 | A | 12/1979 | Kawashima |
| 4,205,248 | A | 5/1980 | Negita |
| 4,223,177 | A | 9/1980 | Nakamura |
| 4,379,244 | A | 4/1983 | Dinger |
| 4,384,232 | A | 5/1983 | Debely |

(Continued)

FOREIGN PATENT DOCUMENTS

| GB | 2075254 | 11/1981 |
|---|---|---|
| JP | 58063212 | 4/1983 |
| JP | 2006217603 A | * 8/2006 |

OTHER PUBLICATIONS

Bottom, Virgil E. "Introduction to Quartz Crystal Unit Design" 1982 Van Nostrand Reinhold Company; 4 pages; New York.

(Continued)

*Primary Examiner* — J. San Martin
(74) *Attorney, Agent, or Firm* — Knobbe, Martens, Olson & Bear LLP

(57) ABSTRACT

Embodiments of the present disclosure are directed to a piezoelectric resonator. The resonator can have a base defining at least a first base portion and a second base portion and two or more vibrating arms projecting from the first base portion, the first vibrating arm being substantially parallel to the second vibrating arm. The resonator can define a generally planar first main surface and a generally planar second main surface defined by the base and the first and second vibrating arms wherein the first main surface is generally parallel to the second main surface. At least one groove can be formed in at least one of the first and second main surfaces of each of the first and second vibrating arms. The resonator can further have at least one vibration isolation arm projecting from the base, the vibration isolation arm being approximately perpendicular to the two or more vibrating arms.

23 Claims, 13 Drawing Sheets

U.S. PATENT DOCUMENTS

| | | | |
|---|---|---|---|
| 4,410,827 | A | 10/1983 | Kogure |
| 4,415,827 | A | 11/1983 | Chuang |
| 4,429,248 | A | 1/1984 | Chuang |
| 4,437,773 | A | 3/1984 | Dinger et al. |
| 4,469,979 | A | 9/1984 | Chuang |
| 4,592,663 | A | 6/1986 | EerNisse et al. |
| 4,652,787 | A | 3/1987 | Zingg |
| 4,785,215 | A | 11/1988 | Blech |
| 4,920,296 | A | 4/1990 | Takahashi et al. |
| 5,302,880 | A | 4/1994 | Kaida |
| 5,331,242 | A | 7/1994 | Petri |
| 5,334,900 | A | 8/1994 | Kawashima |
| 5,341,550 | A | 8/1994 | Kaida |
| 5,719,460 | A | 2/1998 | Watarai et al. |
| 5,824,900 | A | 10/1998 | Konno et al. |
| 5,861,705 | A | 1/1999 | Wakatsuki et al. |
| 5,912,524 | A | 6/1999 | Ohnishi et al. |
| 5,912,592 | A | 6/1999 | Kikushima |
| 5,929,723 | A | 7/1999 | Kimura et al. |
| 6,005,329 | A | 12/1999 | Ikeda et al. |
| 6,194,817 | B1 * | 2/2001 | Yachi et al. .................. 310/370 |
| 6,541,897 | B2 | 4/2003 | Endoh |
| 6,587,009 | B2 * | 7/2003 | Kitamura et al. ............. 331/158 |
| 6,595,054 | B2 | 7/2003 | Paros et al. |
| 6,606,007 | B1 | 8/2003 | Washburn |
| 6,666,091 | B2 | 12/2003 | Hatanaka et al. |
| 6,675,651 | B2 | 1/2004 | Yanagisawa et al. |
| 6,698,292 | B2 | 3/2004 | Kikuchi |
| 6,700,313 | B2 | 3/2004 | Dalla Piazza et al. |
| 6,724,266 | B2 | 4/2004 | Piazza et al. |
| 6,724,271 | B2 | 4/2004 | Sakata et al. |
| 6,768,247 | B2 | 7/2004 | Kitamura et al. |
| 6,791,243 | B2 | 9/2004 | Kawashima |
| 6,806,797 | B2 | 10/2004 | Kikushima |
| 6,830,596 | B1 | 12/2004 | Deckman et al. |
| 6,894,282 | B2 | 5/2005 | Freund et al. |
| 6,894,428 | B2 | 5/2005 | Tanaya et al. |
| 6,897,737 | B2 * | 5/2005 | Sakata et al. .................. 331/156 |
| 6,897,743 | B2 | 5/2005 | Kawashima |
| 6,898,832 | B2 | 5/2005 | Kawashima |
| 6,903,618 | B2 | 6/2005 | Kawashima |
| 6,911,765 | B2 | 6/2005 | Kawashima |
| 6,915,548 | B2 | 7/2005 | Kawashima |
| 6,927,530 | B2 | 8/2005 | Tanaya et al. |
| 6,949,870 | B2 | 9/2005 | Ono et al. |
| 6,961,981 | B2 | 11/2005 | Nagai et al. |
| 7,015,630 | B2 * | 3/2006 | Tanaya ........................... 310/370 |
| 7,015,631 | B2 | 3/2006 | Hirasawa et al. |
| 7,043,986 | B2 | 5/2006 | Kikuchi et al. |
| 7,067,966 | B2 | 6/2006 | Tanaya |
| 7,071,794 | B2 | 7/2006 | Kawashima |
| 7,084,556 | B1 * | 8/2006 | Dalla Piazza et al. ........ 310/370 |
| 7,112,914 | B1 | 9/2006 | Dalla Piazza et al. |
| 7,112,915 | B2 | 9/2006 | Tanaya et al. |
| 7,122,945 | B2 | 10/2006 | Satoh et al. |
| 7,138,752 | B1 | 11/2006 | Dalla Piazza et al. |
| 7,168,319 | B2 | 1/2007 | Dalla Piazza et al. |
| 7,170,218 | B2 | 1/2007 | Kawashima |
| 7,176,604 | B2 | 2/2007 | Nakatani |
| 7,193,354 | B2 | 3/2007 | Kawashima |
| 7,211,936 | B2 | 5/2007 | Tanaya et al. |
| 7,217,304 | B2 | 5/2007 | Deckman et al. |
| 7,253,554 | B2 * | 8/2007 | Dalla Piazza et al. ........ 310/370 |
| 7,279,824 | B2 | 10/2007 | Tanaya et al. |
| 7,412,764 | B2 | 8/2008 | Kawashima |
| 7,550,905 | B2 | 6/2009 | Tanaya et al. |
| 7,902,729 | B2 | 3/2011 | Kawanishi et al. |
| 7,906,890 | B2 | 3/2011 | Kawanishi et al. |
| 2002/0096974 | A1 | 7/2002 | Moon et al. |
| 2003/0222735 | A1 | 12/2003 | Kawashima |
| 2005/0104480 | A1 | 5/2005 | Tanaya |
| 2005/0109037 | A1 | 5/2005 | Deckman et al. |
| 2005/0116586 | A1 | 6/2005 | Tanaya et al. |
| 2005/0134154 | A1 | 6/2005 | Kawashima |
| 2005/0140252 | A1 | 6/2005 | Miyata et al. |
| 2005/0270113 | A1 | 12/2005 | Kawashima |
| 2006/0049722 | A1 | 3/2006 | Dalla Piazza et al. |
| 2006/0066185 | A1 | 3/2006 | Tanaya |
| 2006/0070220 | A1 | 4/2006 | Kawashima |
| 2006/0082261 | A1 | 4/2006 | Tanaya |
| 2006/0087205 | A1 | 4/2006 | Kikushima |
| 2006/0186768 | A1 | 8/2006 | Kawanishi et al. |
| 2006/0255882 | A1 | 11/2006 | Kawashima |
| 2006/0279176 | A1 | 12/2006 | Dalla Piazza et al. |
| 2006/0284694 | A1 | 12/2006 | Kawashima |
| 2007/0024163 | A1 | 2/2007 | Tanaya |
| 2007/0075611 | A1 | 4/2007 | Kawashima |
| 2007/0188055 | A1 * | 8/2007 | Kuwahara ..................... 310/370 |
| 2007/0257741 | A1 | 11/2007 | Kawashima |
| 2008/0179998 | A1 | 7/2008 | Kawashima |

OTHER PUBLICATIONS

Chuang, Shih S. "Quartz Tuning Fork Crystal Using Overtone Flexure Modes" Proc 35$^{th}$ Ann. Freq. Control Symposium, May 1981; 4 Pages; Ft. Monmouth, New Jersey.

International Search Report for PCT Application No. PCT/2009/045083 in 6 pages, and Written Opinion of the International Searching Authority in 8 pages, mailed on Mar. 11, 2009.

Ishii, Osamu, et al.; UHF AT-Cut Crystal Resonators Operating in The Fundamental Mode; 1998 IEEE International Frequency Control Symposium; 6 Pages; Japan.

Micro Structure Bulletin; Newsletter for Nordic Micro Structure Technology, vol. 4, No. 2 May 1996.

Momosaki Eishi. "A Brief Review of Progress in Quartz Tuning Fork Resonators" 1997 IEEE International Frequency Control Symposium; 14 Pages; Japan.

Wuthrich, Christian, et al. "Batch Fabrication of At-Cut Crystal Resonators Up to 200 MH" 1999 Joint Meeting EFTF—IEEE IFCS; 4 Pages; Switzerland.

* cited by examiner

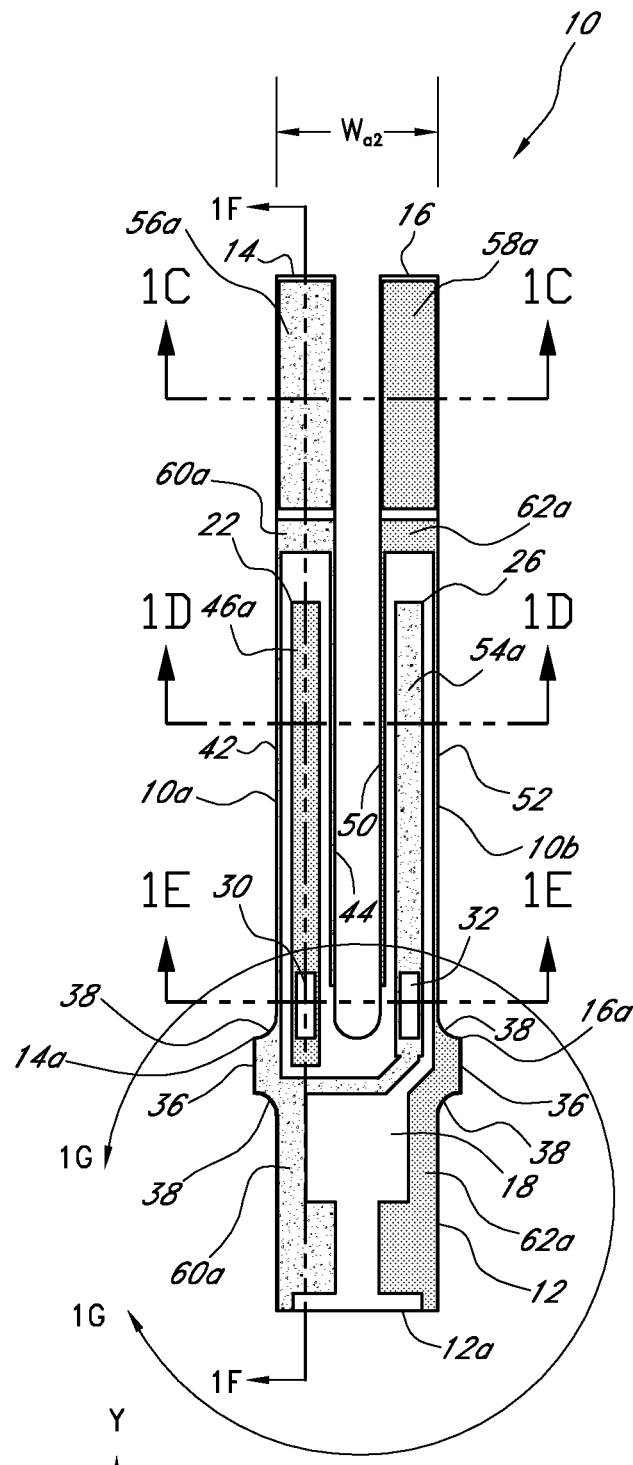
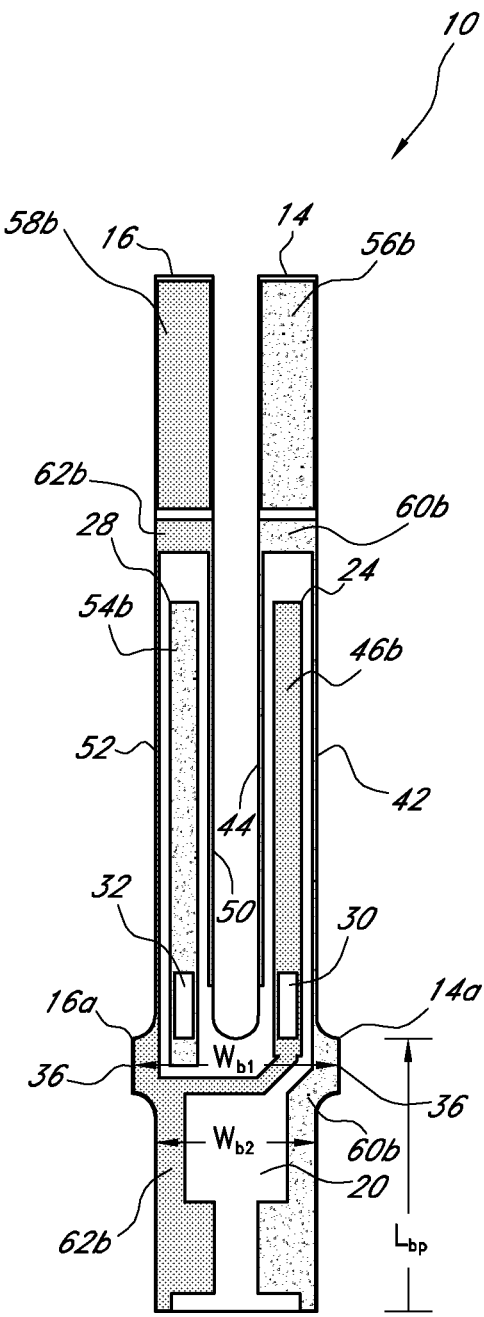
FIG. 1A
FIG. 1B

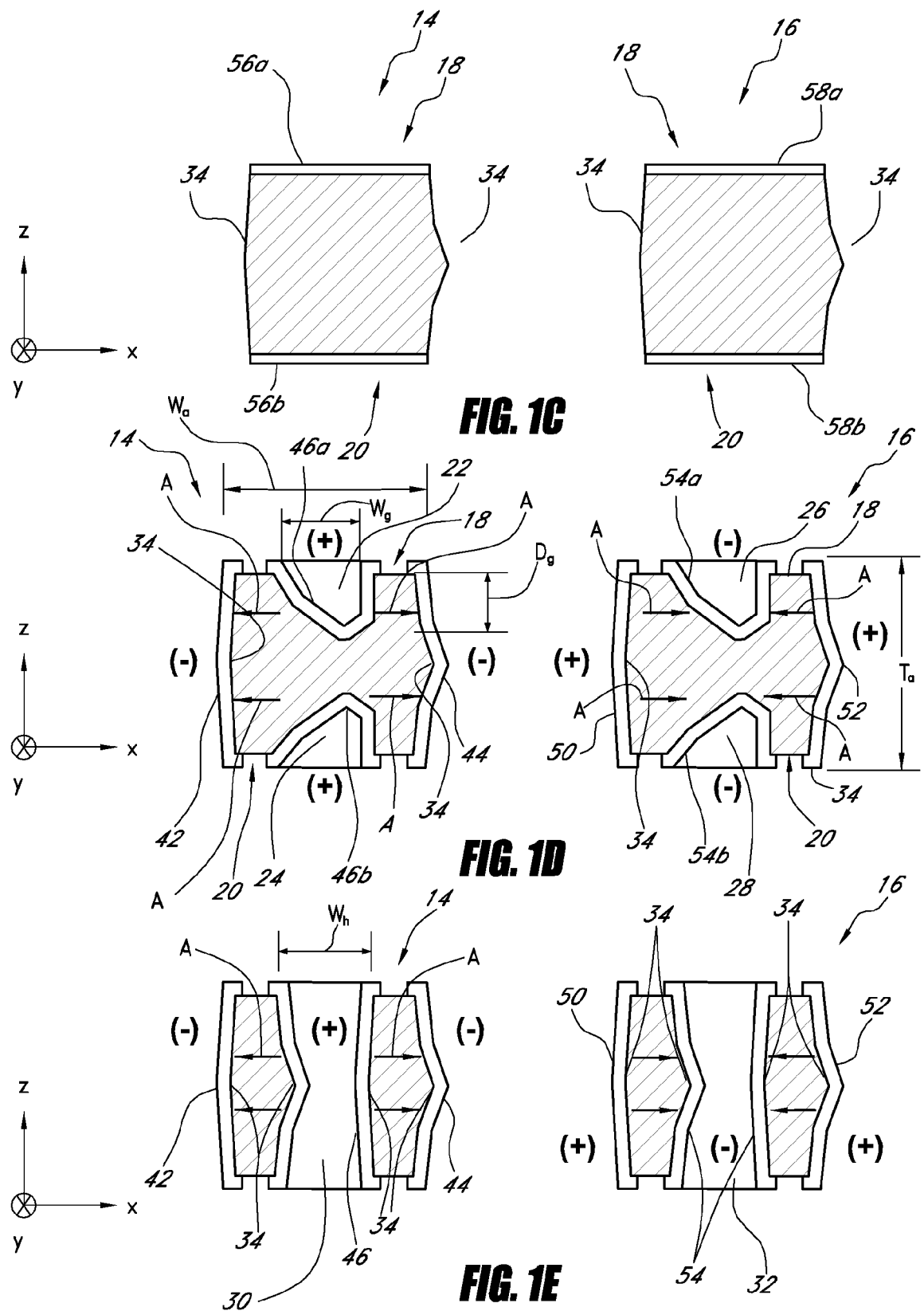

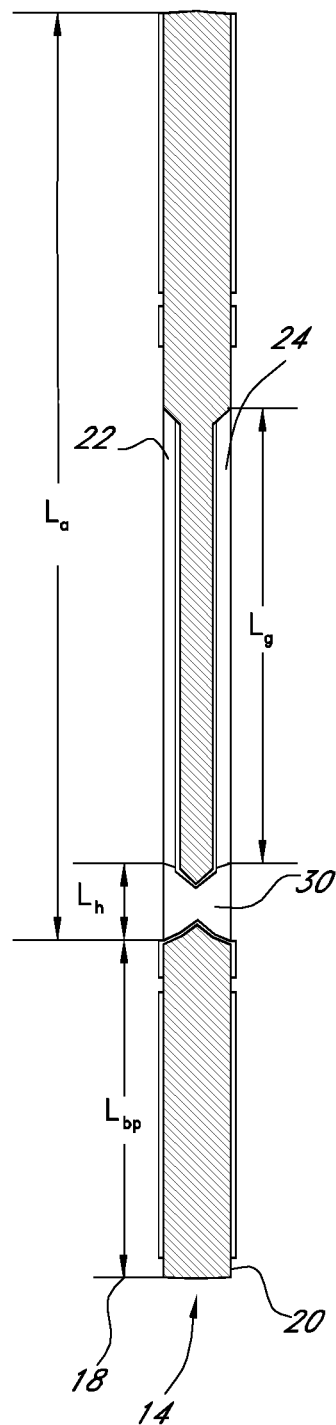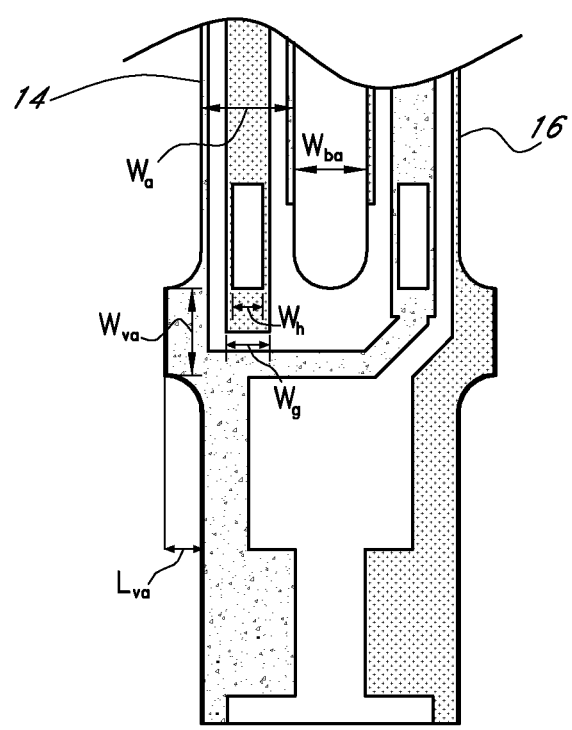
FIG. 1F
FIG. 1G

US 8,446,079 B2

PIEZOELECTRIC RESONATOR WITH VIBRATION ISOLATION

CROSS-REFERENCE TO RELATED APPLICATION

This application claims the benefit of U.S. Provisional Application No. 61/055,927, filed May 23, 2008, the entirety of which is hereby incorporated by reference.

BACKGROUND OF THE DISCLOSURE

1. Field of the Invention

Embodiments disclosed herein relate to resonators having a plurality of vibrating arms attached to a base such as, for example, piezoelectric quartz crystal tuning forks.

2. Description of the Related Art

Piezoelectric devices such as piezoelectric resonators that vibrate in a flexural mode are widely used in time keeping devices, mobile communications devices, and many other types of consumer electronics equipment. As the need for miniaturizing these devices increases, so does the need for miniaturizing the piezoelectric resonators housed therein. However, in many of the conventional designs, as the piezoelectric resonators are miniaturized, in particular, as the base portions of the piezoelectric resonators are shortened, vibrations radiating from the vibrating arms can flow or leak to the base mounting portion of the resonators, potentially reducing the quality factor (Q) of the resonator and potentially increasing the series resistance of the resonator. Accordingly, there is a need for manufacturing a highly miniaturized piezoelectric resonator with a high quality factor (Q), a small series resistance ($R_m$), and a high level of structural stability.

SUMMARY OF SOME EMBODIMENTS

Some embodiments of the present disclosure are directed to piezoelectric resonators and methods of their manufacture and use. With some piezoelectric resonators, it is desired to permit the further miniaturization of the crystal resonators without increasing the series resistance, by providing configurations and features that isolate the base mounting portion of the resonators from the vibrations radiating from the resonating arms during operation.

Some embodiments are directed to a piezoelectric resonator comprising a base defining a first base portion and a second base portion, a first and a second vibrating arm projecting from a first edge of the first base portion of the base, the first vibrating arm being substantially parallel to the second vibrating arm, and a first vibration isolation arm projecting from a first lateral edge of the first portion of the base, and a second vibration isolation arm projecting from a second lateral edge of the first portion of the base so as to be collinear with the first vibration isolation arm, the second lateral edge being opposite and approximately parallel to the first lateral edge, and the first and second vibration isolation arms being approximately perpendicular to the first and second vibrating arms. In some embodiments, the resonator can comprise a generally planar first main surface and a generally planar second main surface defined by the base and the first and second vibrating arms, the first main surface being generally parallel to the second main surface. In some embodiments, the resonator can further comprise an opening formed in each of the first and second vibrating arms, the opening projecting from the first main surface to the second main surface of at least one of the first and second vibrating arms, the opening being configured to conduct an electrical current between the first and second main surfaces of the resonator. The first and second vibration isolation arms can be sized and configured such that a width of the first base portion is greater than a width of any portion of the second base portion.

In some embodiments, the first and second vibration isolation arms can be sized and configured such that a width of the first base portion is from approximately 20% to approximately 40% greater than a width of any portion of the second base portion. Further, in some embodiments, the resonator can comprise a channel formed in the second base portion of the base, the channel being formed in a direction that is parallel to the first and second vibrating arms. The resonator can further comprise at least one groove formed in at least one of the first and second main surfaces of each of the first and second vibrating arms.

Some embodiments disclosed herein are directed to a piezoelectric resonator comprising a base, a first vibrating arm and a second vibrating arm projecting from the base, the first vibrating arm being substantially parallel to the second vibrating arm, a generally planar first main surface and a generally planar second main surface defined by the base and the first and second vibrating arms, the first main surface being generally parallel to the second main surface, and a first and a second vibration isolation arm projecting from the base. In some embodiments, the first and second vibration isolation arms can be approximately perpendicular to the first and second vibrating arms.

In some embodiments, the base can have a first base portion and a second base portion, and the first and second vibration isolation arms can project from the first base portion of the base. Further, the first and second vibration isolation arms can be sized and configured such that a width of the first base portion is greater than a width of any portion of the second base portion. In some embodiments, the first and second vibration isolation arms can be sized and configured such that a width of the first base portion is approximately 30% greater than a width of any portion of the second base portion, or from approximately 20% to approximately 40% greater than a width of any portion of the second base portion. In some embodiments, the second base portion can have a uniform width along the entire length of the second base portion. In some embodiments, the second base portion can taper along the length thereof.

The first and second vibration isolation arms can project from the base in mutually opposing directions and can be collinear. In some embodiments, the resonator can further comprise an opening formed at least partially in each of the first and second vibrating arms and/or in the base, the opening projecting from the first main surface to the second main surface of the resonator. An electrode can be disposed on a surface of the opening to conduct an electrical current between the first and second main surfaces of the resonator.

In some embodiments, the resonator can further comprise a channel formed in the base. The channel can be formed in a direction that is parallel to the first and second vibrating arms or in any other suitable orientation. The channel can be formed in the second base portion of the base, and can have a longitudinal length that is greater than a mounting length of the resonator, or a longitudinal length that is less than a longitudinal length of the second base portion.

In some embodiments, the resonator can further comprise at least one groove (or two parallel grooves) formed in at least one of the first and second main surfaces of each of the first and second vibrating arms. An electrode can be disposed on the groove or grooves formed in at least one of the first and second main surfaces of each of the first and second vibrating arms. An opening can be formed in at least one of the first and second vibrating arms adjacent to the at least one groove and/or in the base of the resonator, the opening projecting from the first main surface to the second main surface.

Some embodiments disclosed herein are directed to a piezoelectric resonator comprising a base defining a first edge and a base edge that is generally parallel to the first edge, a first base portion and a second base portion, the first base portion being defined as the portion of the base between the first edge and the second base portion, and the second base portion being defined as the portion of the base between the first base portion and the base edge. The resonator can further comprise a first vibrating arm and a second vibrating arm projecting from the first edge of the base, the first vibrating arm being substantially parallel to the second vibrating arm, a generally planar first main surface and a generally planar second main surface defined by the base and the first and second vibrating arms, the first main surface being generally parallel to the second main surface. At least one groove can be formed in at least one of the first and second main surfaces of each of the first and second vibrating arms, and wherein the base is sized and configured such that a width of the first base portion is from approximately 20% to approximately 40% greater than a width of any portion of the second base portion. Further, the resonator can have any of the features described in combination with any of the resonators disclosed herein.

Some embodiments disclosed herein are directed to a piezoelectric resonator having, individually or in combination, any of the individual or collective features disclosed herein.

BRIEF DESCRIPTION OF THE DRAWINGS

Certain embodiments of this inventions will now be discussed in detail with reference to the following figures. These figures are provided for illustrative purposes only, and the inventions are not limited to the subject matter illustrated in the figures.

FIG. 1A is a top view of an embodiment of a piezoelectric resonator.

FIG. 1B is a bottom view of the embodiment of the piezoelectric resonator shown in FIG. 1A.

FIG. 1C is a cross-sectional view of the embodiment of the piezoelectric resonator shown in FIG. 1A, taken through line 1C-1C in FIG. 1A.

FIG. 1D is a cross-sectional view of the embodiment of the piezoelectric resonator shown in FIG. 1A, taken through line 1D-1D in FIG. 1A.

FIG. 1E is a cross-sectional view of the embodiment of the piezoelectric resonator shown in FIG. 1A, taken through line 1E-1E in FIG. 1A.

FIG. 1F is a cross-sectional view of the embodiment of the piezoelectric resonator shown in FIG. 1A, taken through line 1F-1F in FIG. 1A.

FIG. 1G is an enlargement of a portion of the embodiment of the piezoelectric resonator shown in FIG. 1A, defined by curve 1G-1G in FIG. 1A.

DETAILED DESCRIPTION OF SOME EXEMPLIFYING EMBODIMENTS

Figure 2A:
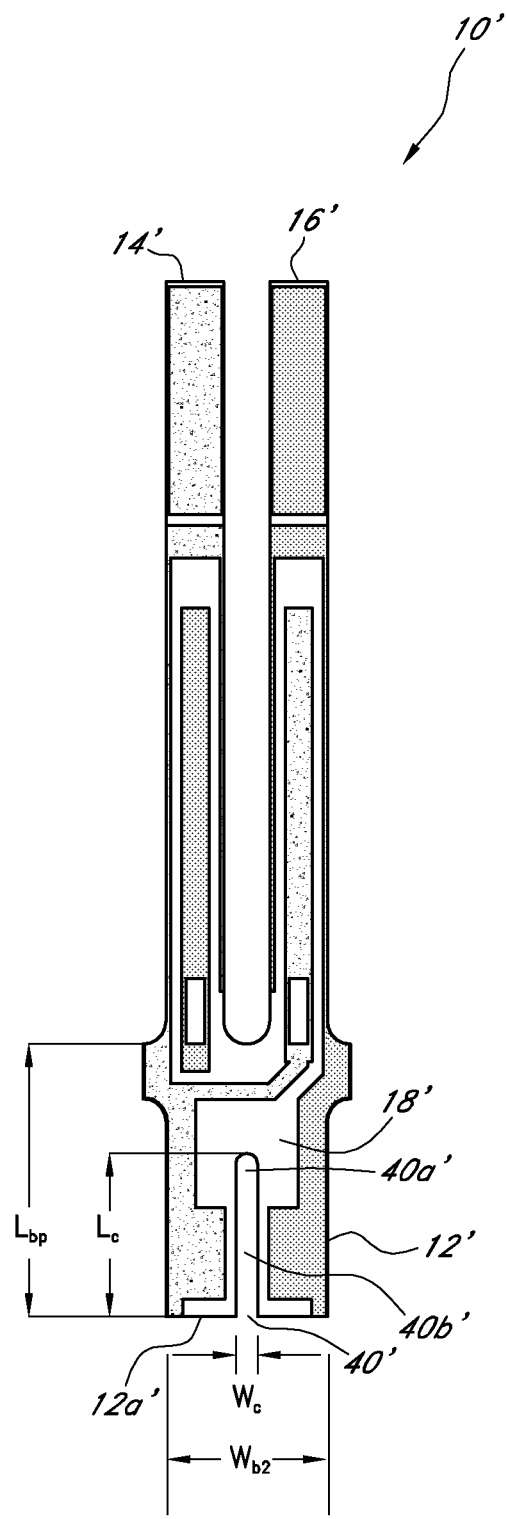
FIG. 2A is a top view of another embodiment of a piezoelectric resonator.

The following detailed description is now directed to certain specific embodiments of the disclosure. In this description, reference is made to the drawings wherein like parts are designated with like numerals throughout the description and the drawings.

In some aspects of the embodiments described herein, a variety of means are shown for making a quartz crystal tuning fork resonator comprising features that can permit a crystal tuning fork resonator manufacturer to reduce the size of the resonators produced and/or increase the quality of the tuning fork resonators. In any embodiments disclosed herein, the resonator can be an oscillator having an integrated circuit or other electronic device.

FIGS. 1A and 1B are top and bottom views, respectively, of an embodiment of a piezoelectric resonator 10, capable of vibrating in a flexural mode. As illustrated therein, the piezoelectric resonator 10 can have a base 12, a first tuning fork arm 14 projecting from the base 12 generally along the y-axis, and a second tuning fork arm 16 projecting from the base 12 generally along the y-axis. The arms can also be referred as tines. The first arm 14 and second arm 16 can be generally parallel to one another. In some embodiments, either or both of the first and second arms 14, 16 can have an uneven or non-uniform width along the length thereof (not shown). For example, without limitation, either or both of the first and second arms 14, 16 can be configured so that that portions of the first and second arms 14, 16 are wider than other portions of the first and second arms 14, 16, or such that some portions define a linear, curved, or other suitable shaped tapering width along the length thereof. In these embodiments, the centerline of each of the first and second arms 14, 16 can be generally parallel to one another. In some embodiments, though not so limited, any of the arms projecting from the base can be vibrating arms, capable of vibrating in a flexural mode. Additionally, in some embodiments, any of the resonators disclosed herein can have a fewer or greater number of arms projecting from the base. For example, in some embodiments without limitations, any of the resonators disclosed herein can have four arms projecting from the base, any of which can be capable of vibrating a flexural mode.

In some embodiments, the first and second arms 14, 16 can be supported by the base 12 so as to project from a first base portion of the base 12. With reference to FIG. 1B, the first base portion can include at least the portion of the base 12 defined by the width represented by Wb1 in FIG. 1B. The base 12 can also define a second base portion, i.e., the portion of the base 12 defined by the width represented by Wb2 in FIG. 1B, which can be less than width Wb1. In some embodiments, the resonator 10 can be mounted to the mounting pads of a ceramic case or other support structure on the second base portion.

With reference to FIG. 1A (which is a top view of the resonator 10), the resonator 10 can define a first main surface 18 and, with reference to FIG. 1B (which is a bottom view of the resonator 10), a second main surface 20. In some embodiments, the first main surface 18 and second main surface 20 can be generally parallel, opposing planar surfaces of the resonator 10. With reference to FIG. 1A, the first arm 14 can define a first groove 22 formed in the first main surface 18 of the first arm 14 and, with reference to FIG. 1B, a second groove 24 formed in the second main surface 20 of the first arm 14. Similarly, with reference to FIG. 1A, the second arm 16 can define a first groove 26 formed in the first main surface 18 of the second arm 16 and, with reference to FIG. 1B, a second groove 28 formed in the second main surface 20 of the second arm 16. However, any of the resonators described herein can be configured to have no grooves formed in the vibrating arms.

In some embodiments, two or more grooves can be formed in each of the first and second main surfaces 18, 20 of each of the first and second arms 14, 16. For example, without limitation, two parallel grooves (not shown) can be formed in each of the first and second main surfaces 18, 20 of each of the first and second arms 14, 16. In this configuration, i.e., with two grooves formed in each of the first and second main surfaces 18, 20 of each of the first and second arms 14, 16, without limitation, the width of each of the grooves can have a width from approximately 0.001 in, or from approximately 0.001 in or less to approximately 0.002 in or more. In this configuration, i.e., with two grooves formed in each of the first and second main surfaces 18, 20 of each of the first and second arms 14, 16, each of the grooves can have the same length as the length of any of the other grooves disclosed herein.

Additionally, with reference to FIGS. 1A and 1B, the first arm 14 can define a first hole or opening 30 therethrough formed generally perpendicular to the first main surface 18 of the resonator 10, projecting from the first main surface 18 to the second main surface 20 of the resonator 10. Similarly, the second arm 16 can define a second hole 32 therethrough formed generally perpendicular to the first main surface 18 of the resonator 10, projecting from the first main surface 18 to the second main surface 20 of the resonator 10. In some embodiments, a hole or opening can be formed in only one of the vibrating arms. In some embodiments, a hole or opening can be formed on any portion of the resonator, including the base. The hole or opening can be configured to conduct an electrical current from one side to the other side of the resonator.

As will be discussed in greater detail below, the through hole 30 can be covered with an electrode to provide an electrical connection between the first and second main surfaces 18, 20 of the resonator 10. The electrical connection can provide a connection between the groove 22 formed on the first main surface 18 of the first arm 14 and the groove 24 formed on the second main surface 20 of the first arm 14. Similarly, the through hole 32 can be covered with an electrode to provide an electrical connection between the groove 26 formed on the first main surface 18 of the second arm 16 and the groove 28 formed on the second main surface 20 of the second arm 16.

By providing an electrical connection through each of the first and second arms 14, 16 in this configuration, the electrical connection between the top and bottom surfaces that was conventionally formed on the inside side wall surface of each of the arms of the resonator near the crotch of the resonators can be eliminated. The conventionally formed electrical connections mentioned above can be less robust than the electrical connection provided by the through holes 30, 32 for the following reason. The portion of each of the arms 14, 16 adjacent to the base 12 can experience the highest level of stress as a result of the resonation of each of the arms 14, 16 during normal operating conditions (each of the arms 14, 16 can oscillate many thousands of times per second during normal operating conditions), and the level of stress can be greater at the side walls than at the center portion of each of the arms 14, 16. In particular, conventional electrical connections between the grooves formed on each of the first and second main surfaces 18, 20 were typically formed on the inside side surfaces of each of the arms 14, 16 adjacent to the base 12, which can experience a higher level of stress as compared to a through hole formed through the center of the arms 14, 16. Electrical connections formed on surfaces of the resonator 10 that experience higher levels of stress are typically more prone to failure than electrical connections formed on surfaces of the resonator 10 that experience lower levels of stress. Therefore, eliminating a pair of the electrical connections that were conventionally formed on the side walls of each of the arms 14, 16 and forming those electrical connections on the through hole through each of the arms 14, 16 where stress levels are lower can improve the robustness of the electrical connections of the resonator 10. However, the location of the electrical connections are not limited to the locations described herein or shown in the figures. The electrical connections can be formed or positioned at any desired or suitable locations on the resonator.

The holes 30, 32 in the resonator 10 (or in any other resonator disclosed herein) can be positioned at any desired location along the arms 14, 16, respectively. In some embodiments, as in the illustrated embodiment, the holes 30, 32 can be positioned at or adjacent to the base 12 of the arms 14, 16, or such that a portion of each of the holes 30, 32 is positioned in the base 12 while a portion of each of the holes 30, 32 is positioned in the arms 14, 16, respectively. In some embodiments, the holes 30, 32 can be positioned adjacent to or near the proximal end of the grooves 22, 24, 26, 28 (i.e., the end of the grooves 22, 24, 26, 28 closer to the base 12), adjacent to or near the distal end of the grooves 22, 24, 26, 28 (i.e., the end of the grooves 22, 24, 26, 28 further from the base 12), near the unrestrained end portions of the arms 14, 16, or at any position along the arms 14, 16. Positioning the holes adjacent to or near the distal end of the grooves 22, 24, 26, 28 can improve the structural integrity of the resonator.

While two holes 30, 32 are shown, any number of holes can be formed in each of the arms 14, 16, including two, three, or more holes per arm 14, 16. Further, the holes 30, 32 can be formed in the arms 14, 16 at any desired orientation relative to the first main surface 18 or second main surface 20.

FIGS. 1C, 1D, and 1E are cross-sectional views of the arms 14, 16 of the embodiment of the piezoelectric resonator 10 shown in FIG. 1A, taken through lines 1C-1C, 1D-1D, and 1E-1E, respectively, in FIG. 1A. Figure is a 1F cross-sectional view of the embodiment of the piezoelectric resonator shown in FIG. 1A, taken through line 1F-1F in FIG. 1A. With reference to these Figures, the geometry of the arms 14, 16 will be described in greater detail. The electrode films covering portions of the arms 14, 16 and base 12 will be described further below. As shown in FIG. 1C, in some embodiments, the cross-sectional shape of the arms 14, 16 at the distal end portion of the arms 14, 16 can be generally rectangular. In some embodiments, as in the illustrated embodiment, the cross-sectional shape of the arms 14, 16 at the distal end portion of the arms 14, 16 can be generally square such that the thickness of the crystal portion of each arm 14, 16 in the x-direction is approximately the same as the thickness of the crystal portion of each arm in the z-direction.

However, when a resonator 10 is formed by wet etching a wafer of a piezoelectric single crystal material having etching anisotropy, such as quartz crystal, the cross-sections of each of the arms 14, 16 often vary from a symmetrical shape due to the etching anisotropy of the single crystal material. In particular, the etching rate of a quartz crystal typically has a crystal-axis dependence. Quartz crystal is prone to be etched in widthwise direction of the resonating arm (i.e., the x-direction). Accordingly, as illustrated in FIGS. 1C-1E, the wet etching procedures that are typically used to form resonating arms can result in asymmetry in the x-direction. In particular, with reference to FIG. 1C, bulges or protrusions 34 in the positive and negative x-directions can result when the arms 14, 16 are formed using typical wet etching procedures for piezoelectric single crystal materials. As a result, the cross-sections of the arms 14, 16 having the grooves 22, 24, 26, 28 are typically not shaped like an ideal rectangle or "H." Rather, the cross-sections of the arms 14, 16 are shaped more like as shown in FIG. 1D.

Therefore, any reference herein to a square, rectangular, "H" shaped, or other theoretical cross-sectional shape shall be meant to refer the theoretical cross-sectional shape and the actual cross-sectional shape that can define protrusions or other asymmetrical features as a result of etching anisotropy. However, the resonators described herein are not limited to being formed by wet etching. Any of the resonators described herein can be formed by any suitable process currently known or later developed. Some manufacturing techniques, such as, but not limited to, dry etching, typically result in more symmetrical cross-sections. Because an "H" shaped cross-section can have a symmetrical structure and can provide an even electrical field along each crystal tine or arm, the resistance of the piezoelectric resonator is expected to be lower for a given design. Accordingly, in some embodiments, the resonator 10 or any other resonator described herein can actually possess any of the theoretical symmetrical cross-sectional shapes described herein a formed by other cutting procedures that do not exhibit crystal directional dependence.

As illustrated in FIG. 1D and described above, grooves 22, 24, 26, 28 can be formed in each of the arms 14, 16. In some embodiments, the grooves 22, 24, 26, 28 can be formed to increase the electrical field strength and, therefore increase the electrical field efficiency along the x-axis, of each of the electrode pairs, as is known in the field. The arrows illustrated in FIGS. 1D and 1E illustrate the direction of the flow of electricity between the oppositely charged electrodes.

The grooves 22, 24, 26, 28 can define any suitable cross-sectional shape or size. In some embodiments, each of the grooves 22, 24, 26, 28 can be formed in the approximate center of each of the arms 14, 16. Note that the etching anisotropy described above can also affect the shape and symmetry of each of the grooves 22, 24, 26, 28 that are formed in the arms 14, 16, thus causing the arms to depart from the theoretical "H" shaped cross-section, as illustrated in FIG. 1D. In some embodiments, each of the grooves 22, 24, 26, 28 can be formed in each of the arms 14, 16 at a position that is offset from the centerline of each of the arms 14, 16, to compensate for the etching anisotropy described above, so that each of the arms 14, 16 can define a generally symmetrical or balanced cross-section along the lengths thereof.

In some embodiments, when the length of the groove increases relative to the length of the vibration arms, the fundamental resistance and overtone resistance can decrease. However, the resistance of the overtone mode can decrease much faster than the resistance of the fundamental mode. This can cause the overtone mode resistance to be much less than the fundamental mode resistance. As a consequence, by configuring the resonator to have a very low overtone resistance, there is a risk that the resonator can operate as an electrical circuit in the overtone mode instead of operating in a desired fundamental mode. It can be desirable to have a high performance resonator with a lower fundamental resistance and a reasonable overtone resistance. The length Lg of each of the grooves can be chosen depending on the fundamental and overtone resistance requirements of the resonator.

In some embodiments, each of the grooves 22, 24, 26, 28 can define a length (represented by Lg in FIG. 1F) that is less than the length of each of the arms 14, 16 (represented by La in FIG. 1F). In some embodiments, though not so limited, in each of the arms 14, 16, the length Lg of the grooves 22, 24 or 26, 28 plus the length Lh of each of the holes 30, 32, respectively, if any, can be approximately 60% of the length La of each of the arms 14, 16. I.e., for the first arm 14, the length Lg of the groove 22 plus the length Lh of the hole 30, if any, can be approximately 60% of the length La of the arm 14. In some embodiments, though not so limited, the length Lg plus the length Lh of each of the grooves 22, 24, 26, 28 can be between approximately 40% or less and approximately 90%, or between approximately 50% and approximately 70%, or between approximately 55% and approximately 65% of the length La of each of the arms 14, 16, or to or from any values within these ranges.

In some embodiments, as in the illustrated embodiment, each of the grooves 22, 24, 26, 28 can be positioned adjacent to each of the holes 30, 32. However, the resonator 10 is not so limited. The resonator 10 can be configured with features having any suitable shape or size within or outside of the above dimensional ranges.

In some embodiments, each of the grooves 22, 24, 26, 28 can define a width (represented by Wg in FIG. 1D) that is less than the width of each of the arms 14, 16 (represented by Wa in FIG. 1D). As the width Wg of each of the grooves 22, 24, 26, 28 increases relative to the width Wa of each of the arms 14, 16 (without exceeding the width Wa of the arms 14, 16), the width of each of the arms 14, 16 between the grooves 22, 24, 26, 28 and the sides of each of the arms 14, 16 decreases, thereby increasing the electrical field efficiency. However, the width Wg of each of the grooves 22, 24, 26, 28 relative to the width Wa of each of the arms 14, 16 can depend on manufacturing capabilities and tolerances.

In some embodiments, though not so limited, the width Wg of each of the grooves 22, 24, 26, 28 can be approximately one-third (i.e., 33%) or less of the width Wa of each of the arms 14, 16. In some embodiments, though not so limited, the width Wg of each of the grooves 22, 24, 26, 28 can be from approximately 33% to approximately 70% or more of the width Wa of each of the arms 14, 16. In some embodiments (not illustrated), each of the grooves 22, 24, 26, 28 can be formed so as to extend past each of the holes 30, 32 so that the holes 30, 32 are formed within the grooves. However, the resonator 10 is not so limited. The resonator 10 can be configured with features having any suitable shape or size either within or outside of the above dimensional ranges.

Typical flexural mode resonators in the field generally operate at a frequency between approximately 10 kHz and approximately 600 kHz. Additionally, in some embodiments, because the frequency (f) of the resonator is a function of the width Wa and the length La of each of the resonator's arms, the desired frequency of the resonator can dictate the chosen width Wa and length La of each of the resonator's arms.

$$f \propto \frac{Wa}{La^2}$$

In some embodiments, the width Wa of each of the arms 14, 16 can be from approximately 0.001 in. to approximately 0.008 in, or from approximately 0.002 in. to approximately 0.004 in, or from or to any values within these ranges. Additionally, the width Wa of each of the arms 14, 16 can be greater than the width Wg of each of the grooves 22, 24, 26, 28 that can be formed in the arms 14, 16. In some embodiments, where the desired operating frequency is approximately 32.768 kHz, the width Wa of each of the arms 14, 16 can be approximately 0.005 in, and the length La of each of the arms 14, 16 can be approximately 0.070 in, or from approximately 0.050 in or less to approximately 0.080 in or more, or from approximately 0.060 in to approximately 0.070 in, or to or from any values within these ranges. In some embodiments, where the desired operating frequency is approximately 32.768 kHz, the width Wa of each of the arms 14, 16 can be approximately 0.004 in, and the length La of each of the arms 14, 16 can be approximately 0.065 in, or from approximately 0.045 in or less to approximately 0.080 in or more, or from approximately 0.060 in to approximately 0.070 in, or to or from any values within these ranges. Additionally, in some embodiments, where the width Wa of each of the arms 14, 16 is approximately 0.005 in, the width Wg of each of the grooves can be approximately 0.003 in.

In some embodiments, the overall length of the resonator 10 (i.e., the distance from the base edge to the ends of the vibration arms) can be approximately 0.095 in. In some embodiments, the overall length of the resonator 10 can be from approximately 0.080 in or less to approximately 0.100 in or more. In some configurations, the overall length of the resonator can be limited by the size of the cavity in the ceramic or other package, and can vary depending on the desired frequency of the resonator. In some embodiments, a resonator having a frequency of approximately 2.768 kHz can have an overall resonator length from approximately 0.080 in or less to approximately 0.100 in or more, or from approximately 0.090 in to approximately 0.095 in, or to or from any values within these ranges. For resonators having a higher frequency, the overall length of the resonator can be less than 0.090 in for the same tine width. Additionally, in some embodiments, to optimize performance for a given overall length, the width of the tines can be varied or adjusted.

In some embodiments, as in the illustrated embodiment where the overall length of the resonator 10 can be approximately 0.0950 in., the width Wa of each of the arms 14, 16 can be approximately 0.050 in. In some embodiments, though not so limited, the width Wa of each of the arms 14, 16 can be from approximately 0.001 in. or less to approximately 0.008 in. or more, or from approximately 0.003 in. to approximately 0.005 in. Accordingly, in some embodiments, as in the illustrated embodiment, the width Wg of each of the grooves 22, 24, 26, 28 can be approximately 0.002 in. In some embodiments, though not so limited, the width Wg of each of the grooves 22, 24, 26, 28 can be from approximately 0.001 in. or less to approximately 0.007 in. or more, or from approximately 0.002 in. to approximately 0.004 in. However, the resonator 10 is not so limited. The resonator 10 can be configured with features having any suitable shape or size either within or outside of the above dimensional ranges.

Note that typical processing techniques for the fabrication of piezoelectric resonators, such as typical wet etching processes, inherently produce widely varying results in terms of final feature dimensions. For this reason, dimensions listed in this disclosure are only meant to be non-limiting, exemplifying dimensions, and are not meant to be the actual, final dimensions of resonators produced in accordance with this disclosure.

In some embodiments, the grooves 22, 24, 26, 28 can be formed so that the approximate depth of the first grooves 22, 26 from the first main surface 18 in the negative z-direction is approximately equal to the depth of the second grooves 24, 28 from the second main surface 20 in the positive z-direction. In some embodiments, each of the grooves 22, 24, 26, 28 can define a depth (represented by Dg in FIG. 1D) that is less than approximately one-half (i.e., 50%) of the thickness of each of the arms 14, 16 (represented by Ta in FIG. 1D). In some embodiments, the depth of the groove can be chosen depending on the requirements of the resonator's resistance (Rm)—when the depth of the groove Dg is increased, the resistance of the resonator can decrease for a given groove width Wg. In some embodiments, though not so limited, the depth Dg of each of the grooves 22, 24, 26, 28 can be approximately 30%, or from approximately 10% or less to approximately 45%, or from approximately 20% to approximately 35%, or from approximately 25% to approximately 30% of the thickness Ta of each of the arms 14, 16, or from or to any values within these ranges.

In some embodiments, the thickness Ta of each of the arms or the base of any resonator disclosed herein can be approximately 0.005 in. In some embodiments, the thickness Ta of each of the arms or the base of any resonator disclosed herein can be from approximately 0.001 in or less to approximately 0.010 in or more, or from approximately 0.004 in to approximately 0.006 in, or from or to any values within these ranges. The chosen thickness of the arms can depend on the width of the arms and, for some embodiments, can be approximately the same as the width of the arms. Therefore, the thickness of the arms can be reduced when the width of the arms is reduced.

As mentioned above, with reference to FIG. 1E, through holes 30, 32 can be formed in each of the arms 14, 16 from the first main surface 18 to the second main surface 20 of the resonator 10. In some embodiments, the through holes 30, 32 can provide an electrical connection between the first main surface 18 and the second main surface 20 of the resonator 10. The holes 30, 32 can define a circular, square, rectangular or any other suitable cross-sectional shape. In some embodiments, each of the holes 30, 32 can be formed in the approximate center of each of the arms 14, 16. As illustrated, the etching anisotropy described above can also affect the shape and symmetry of each of the holes 30, 32 that are formed in the arms 14, 16. In some embodiments, each of the holes 30, 32 can be formed in each of the arms 14, 16 at a position that is offset from the centerline of each of the arms 14, 16 to compensate for the etching anisotropy described above, so that each of the arms 14, 16 can define a generally symmetrical cross-section along the lengths thereof.

In some embodiments, each of the holes 30, 32 can define a width (represented by Wh in FIG. 1G) that is approximately equal to or less than the width Wg of each of the grooves 22, 24, 26, 28. In some embodiments, each of the holes 30, 32 can define a width that is approximately greater than the width Wg of each of the grooves 22, 24, 26, 28. As such, in some embodiments, each of the holes 30, 32 can define a width that is approximately 0.002 in, or from approximately 0.001 in or less to approximately 0.004 in or more, or from approximately 0.002 in to approximately 0.003 in, or to or from any values within these ranges.

In some embodiments, a deposition film can completely circumscribe one or more of the holes 30, 32 (i.e., on either the first main surface 18 or on second main surface 20 of each of the arms 14, 16) to increase the electrical connection around the perimeter of each of the holes 30, 32. This can increase the likelihood that at least a portion of each of the holes of 30, 32 provides a reliable connection between the first main surface 18 and the second main surface 20. However, the resonator 10 is not so limited. The resonator 10 can be configured with features having any suitable shape or size.

In some embodiments, as in the illustrated embodiment where the width Wh of the hole 30 can be approximately less than the width Wg of the individual or collective grooves 22, 24, 26, 28, each of the holes 30, 32 can define a width Wh that is approximately 80% or less of the width Wg of each of the grooves 22, 24, 26, 28. In some embodiments, though not so limited, each of the holes 30, 32 can define a width Wh that is from approximately 55% to approximately 85%, or from approximately 60% to approximately 70% of the width Wg of each of the grooves 22, 24, 26, 28. However, the resonator 10 is not so limited. The resonator 10 can be configured with features having any suitable shape or size either within or outside of the above dimensional ranges.

In some embodiments (not illustrated), where the width Wh of the hole 30 is approximately equal to or greater than the width Wg of each of the grooves 22, 24, 26, 28, each of the holes 30, 32 can define a width Wh that is between approximately 100% and approximately 150% or more, or between approximately 115% and approximately 135%, or between approximately 120% and approximately 130% of the width Wg of each of the grooves 22, 24, 26, 28. However, the resonator 10 is not so limited. The resonator 10 can be configured with features having any suitable shape or size either within or outside of the above dimensional ranges.

In some embodiments, the masking defining each of the holes 30, 32 can be sized and configured to ensure that each of the holes 30, 32 will be etched to a large enough size during a wet etching process such that an electrode formed on the surface of each of the holes 30, 32 will extend continuously from the first main surface 18 to the second main surface 20 in at least a portion of each of the holes 30, 32. In other words, each of the holes 30, 32 will preferably be formed to a size that is large enough to ensure that the electrode formed on the surface of the holes 30, 32 will cover the entire surface of the holes 30, 32. In some embodiments, such as resonator 10 having rectangular shaped through holes 30, 32, both the length Lh and the width Wh of each of the through holes 30, 32 can be optimized so as to be the smallest dimensions feasible that ensure a reliable electrode covering each of the through holes 30, 32 will extend from the first main surface 18 to the second main surface 20.

Similarly, in some embodiments, each of the holes 30, 32 can define a length (represented by Lh in FIG. 1F) that is substantially less than the length Lg of each of the grooves 22, 24, 26, 28. In particular, in some embodiments, each of the holes 30, 32 can define a length Lh that is between approximately 5% or less and approximately 30%, or between approximately 10% and approximately 20% of the length Lg of each of the grooves 22, 24, 26, 28. In some embodiments, each of the holes 30, 32 can define a length Lh that is approximately 0.004 in, or from approximately 0.002 in or less to approximately 0.020 in or more, or from approximately 0.005 in to approximately 0.015 in, or from approximately 0.008 in to approximately 0.012 in. However, the resonator 10 is not so limited. The resonator 10 can be configured with features having any suitable shape or size either within or outside of the above dimensional ranges. In some embodiments, when the length Lh of the holes is too large, the strength of the vibration arms 14, 16 can be compromised and the flexural vibration of the resonator can become unstable, which can cause the quality Q of the resonator to decrease.

FIG. 1G is an enlargement of a portion of the embodiment of the piezoelectric resonator shown in FIG. 1A, defined by curve 1G-1G in FIG. 1A. With reference to FIGS. 1A, 1B, and 1G, vibration isolation arms 36 (also referred to herein as vibration arms) can be formed on the resonator 10 to reduce the amount of vibration leakage from the arms 14, 16 to the base 12. In some embodiments, as in the illustrated embodiment, the vibration isolation arms 36 can be supported by the first base portion of the base 12 and can project from a first edge of the base 12. Again, with reference to FIG. 1B, the first base portion is the portion of the base 12 defined by the width represented by Wb1 in FIG. 1B. As shown in FIG. 1A, the vibration isolation arms 36 can be configured so as to project from the first base portion of the base 12 generally along the x-axis, so as to be approximately perpendicular to the first and second tuning fork arms 14, 16. Additionally, fillets or rounded surfaces 38 can be formed adjacent to the vibration isolation arms and the opposing side surfaces of each of the vibration isolation arms 36.

The vibration isolation arms 36 can define any suitable shape, including without limitation the stepped or generally rectangular shape shown in the embodiment illustrated in the figures. In some embodiments, at least a portion of the vibration isolation arms 36 can define a arcuate, triangular, or polygonal shape. For example, without limitation, the distal end portions of the vibration arms can be rounded, pointed, tapered, or otherwise.

In some embodiments, the length of the base 12 (represented by Lbp in FIG. 1F) can be reduced and, hence, miniaturized, without decreasing the quality factor or increasing the crystal resistance of the resonator 10 by forming vibration isolation arms 36 on the resonator 10. As illustrated most clearly in FIGS. 1A and 1B, in some embodiments, the resonator 10 can be configured so that the vibration isolation arms 36 project laterally (i.e., in the positive and negative x-directions) from the side surfaces 10a, 10b of the base 12 of the resonator 10. The vibration isolation arms 36 can be positioned adjacent to the proximal ends 14a, 16a of the arms 14, 16, or can be positioned at any location along the side surfaces 10a, 10b between the proximal ends 14a, 16a of the arms 14, 16 and the base edge 12a of the base 12. Additionally, in some embodiments, more than two vibration isolation arms 36 can be formed on the base 12 of the resonator 10.

With reference to FIG. 1G, in some embodiments, the width Wva of each of the vibration isolation arms 36 can be approximately equal to the width Wa of each of the arms 14, 16. In some embodiments, the width Wva of each of the vibration isolation arms 36 can be less than the width of each of the arms 14, 16. For example, without limitation, the width Wva of each of the vibration isolation arms 36 can be approximately 0.0025 in, or from approximately 0.001 in or less to approximately 0.010 in or more, or from approximately 0.002 in to approximately 0.006 in.

In some embodiments, the vibration isolation arms 36 can be sized and configured so that the width (represented by Wb1 in FIG. 1B) of the base 12 in the region of the vibration isolation arms 36 is greater than the width (represented by Wb2 in FIG. 1B) of the base 12 in the region of the base 12 adjacent to the base edge 12a of the base 12. In some embodiments, width Wb2 can be greater than the width (represented by Wa2 in FIG. 1A) from the side surface 10a of the first arm 14 to the side surface 10b of the second arm 16 so as to provide an increased base area for mounting purposes. In some embodiments, the increased vibration isolation arms 36 can reduce the amount of vibration leakage from the arms 14, 16 to the base 12 of the resonator and, hence, increase the quality factor of the resonator.

In particular, in some embodiments, the resonator 10 and the vibration isolation arms 36 can be configured so that the width Wb1 of the first base portion of the base 12 is approximately 30% greater than the width Wb2 of the second base portion of the base 12. In some embodiments, the vibration isolation arms 36 can be configured so that the width Wb1 of the first base portion of the base 12 is from approximately 15% or less to approximately 45% or more, or from approximately 20% to approximately 40%, or from approximately 25% to approximately 35%, greater than the width Wb2 of the second base portion of the base 12. These configurations can reduce the amount of vibration leakage from the arms 14, 16 to the base 12 of the resonator 10 and, hence, increase the quality factor of the resonator 10.

In some embodiments, the width Wb1 of the first base portion of the base 12 can be approximately 0.022 in, or from approximately 0.018 in or less to approximately 0.026 in or more, or from approximately 0.019 in to approximately 0.025 in, or from approximately 0.021 in to approximately 0.023 in. Further, in some embodiments, the width Wb2 of the second base portion of the base 12 can be approximately 0.014 in, or from approximately 0.010 in or less to approximately 0.025 in or more, or from approximately 0.012 in to approximately 0.018 in, or from approximately 0.014 in to approximately 0.016 in. However, the configuration of the vibration isolation arms 36 is not is not so limited. The resonator 10 can be configured with features having any suitable shape or size either within or outside of the above dimensional ranges.

As previously mentioned, grooves 22, 24, 26, 28 can be formed in the arms 14, 16 to improve the electrical field efficiency of the resonator 10. In particular, with reference to FIG. 1D, side electrodes 42, 44 can be formed on the generally opposing side surfaces of the arm 14. Additionally, center electrode 46a can be formed on the surface of the groove 22 and an electrode 46b can be formed on the surface of the groove 24. With reference to FIGS. 1A and 1B, each of the electrodes 46a, 46b can extend into the base 12 on each of the first and second main surfaces 18, 20, respectively. Similarly, with reference to FIG. 1D, side electrodes 50, 52 can be formed on the generally opposing side surfaces of the arm 16. Additionally, electrode 54a can be formed on the surface of the groove 26 and an electrode 54b can be formed on the surface of the groove 28. With reference to FIGS. 1A and 1B, each of the electrodes 54a, 54b can extend into the base 12 on each of the first and second main surfaces 18, 20, respectively.

Accordingly, in some embodiments, with reference to FIG. 1E, side electrodes 42 and 44 can be formed on the generally opposing side surfaces of the arm 14 adjacent to the through hole 30. Additionally, electrode 46 (which can be the same as electrode 46a or 46b) can be formed on the surface of the hole 30. Similarly, electrodes 50 and 52 can be formed on the generally opposing side surfaces of the arm 16 adjacent to the through hole 32. Additionally, electrode 54 (which can be the same as electrode 54a or 54b) can be formed on the surface of the hole 32.

Further, with reference to FIG. 1C, a film 56a can be formed on the first main surface 18 of the first arm 14, and a film 56b can be formed on the second main surface 20 of the first arm 14. Similarly, a film 58a can be formed on the first main surface 18 of the second arm 16, and a film 58b can be formed on the second main surface 20 of the second arm 16. In some embodiments, as in the illustrated embodiment, the films 56a, 56b, 58a, and 58b are preferably electrically isolated from the other electrodes on the resonator 10. The films 56a, 56b, 58a, and 58b are preferably formed on the first and second base surfaces 18, 20 to permit the manufacturer to fine tune the resonation frequency of each of the arms 14, 16. In particular, a manufacturer can ablate portions of any of the films 56a, 56b, 58a, and 58b using a laser beam or by other suitable methods to adjust the weight and, hence, the resonation frequency of each of the arms 14, 16.

Additionally, with reference to FIGS. 1A and 1B, a linking electrode 60a can be formed on the first main surface 18 of the base 12 and the first arm 14. The linking electrode 60a can be in electrical communication with and, therefore, can interconnect, all of the electrodes 42, 44, 54, 54a, and 54b. Similarly, a linking electrode 60b can be formed on the second main surface 20 of the base 12 and the first arm 14. The linking electrode 60b can be and, therefore, can interconnect, all of the electrodes 42, 44, 54, 54a, 54b, and 60a. The portion of the linking electrode 60a formed across the first main surface 18 of the first arm 14 and the portion of the linking electrode 60b formed across the second main surface 20 of the first arm 14 can provide a connection between the electrodes 42 and 44 formed on the sides of the first arm 14.

A linking electrode 62a can be formed on the first main surface 18 of the base 12 and the second arm 16. The linking electrode 62a can be in electrical communication with and, therefore, interconnect, all of the electrodes 46, 46a, 46b, 50, and 52. Similarly, a linking electrode 62b can be formed on the second main surface 20 of the base 12 and the second arm 16. The linking electrode 62b can be in electrical communication with to and, therefore, interconnect, all of the electrodes 46, 46a, 46b, 50, 52, and 62a. The portion of the linking electrode 62a formed across the first main surface 18 of the second arm 16 and the portion of the linking electrode 62b formed across the second main surface 20 of the second arm 16 can provide a connection between the electrodes 50 and 52 formed on the sides of the second arm 16.

As illustrated most clearly in FIGS. 1D and 1E, in some embodiments, the electrodes 42, 44, 54, 54a, and 54b can have the same electrical polarity. Additionally, in some embodiments, the electrodes 46, 46a, 46b, 50, and 52 can have the same electrical polarity. In the illustrated embodiment, the electrodes 42, 44, 54, 54a, and 54b can have an opposite electrical polarity as compared to electrodes 46, 46a, 46b, 50, and 52.

In this configuration, when a direct voltage is applied to the resonator 10 such that the electrodes 46, 46a, 46b, 50, and 52 are positively charged and the electrodes 42, 44, 54, 54a, and 54b are negatively charged as illustrated in FIGS. 1D and 1E, an electric field can result in a direction that is generally perpendicular to the side surfaces of the arms 14, 16. In FIGS. 1D and 1E, the electrical fields in each of the arms 14, 16 are represented by the arrows A. As the electric field occurs in a direction that is generally perpendicular to the sides of each of the arms 14, 16, each of the arms 14, 16 can distort, resulting in the flexural mode vibration of the arms 14, 16 of the resonator 10. As mentioned, the grooves 22, 24, 26, 28 can be formed on each of the arms 14, 16 to increase the electrical field strength and, therefore increase the electrical field efficiency, of each of the electrode pairs. This can be achieved by providing a shorter distance between the oppositely charged electrodes, as shown most clearly in FIGS. 1D and 1E.

FIG. 2A is a top view of another embodiment of a piezoelectric resonator 10'. In some embodiments, the resonator 10' can comprise any other features, sizes, or other configurations of the resonator 10 described above, or of any other resonator described herein, in addition to or in the alternative with respect to any of the features or configurations described below. With reference to FIG. 2A, a channel 40' can be formed in the base 12' from the first main surface 18' to the second main surface (not shown) of the resonator 10'. In some embodiments, the channel 40' can be formed in the second base portion of the base 12'. In some embodiments, more than one channel 40' can be formed in the base 12' or in another suitable portion of the resonator 10'. For example, without limitation, FIGS. 2C and 2D illustrate different configurations of multiple channels 40'', 40''', respectively, that can be formed in the base 12'', 12''', respectively, of the resonator 10', 10'''. Without limitation, in some embodiments, as in the illustrated embodiment, the channels 40'' can be formed so as to be generally parallel to one another. Each of the channels 40'' can define any suitable range of widths Wc.

The channel 40' can reduce the amount of vibration leakage from the arms 14', 16' to the base 12' of the resonator 10'. Thus, in some embodiments, the length of the base 12' (represented by Lbp in FIG. 2A) can be reduced and, hence, miniaturized, without decreasing the quality factor or increasing the crystal resistance of the resonator 10' by forming the channel 40' in the base of the resonator 10'. Further, in some embodiments, the channel 40' can prevent or reduce the likelihood of an epoxy short between the mounting pads of the case during the assembly process.

In the illustrated embodiment, the channel 40' can comprise a generally semicircular end portion 40a' and a generally rectangular cross-section proximal portion 40b'. In some embodiments, as in the illustrated embodiment, the proximal portion 40b' of the channel 40' can be formed in the base 12' of the resonator 10' so as to pass through the base edge 12a' of the resonator 10'. However, in some embodiments of the resonator 10' or any resonators disclosed herein, the base 12' of the resonator 10' can be formed so that the channel 40' does not penetrate through the base edge 12a' of the resonator 10' (not illustrated). In other words, in some embodiments, the channel 40' can be formed in the base 12' of the resonator 10' so as to form a completely enclosed geometry such that the base edge 12a' is continuous.

Figure 3:
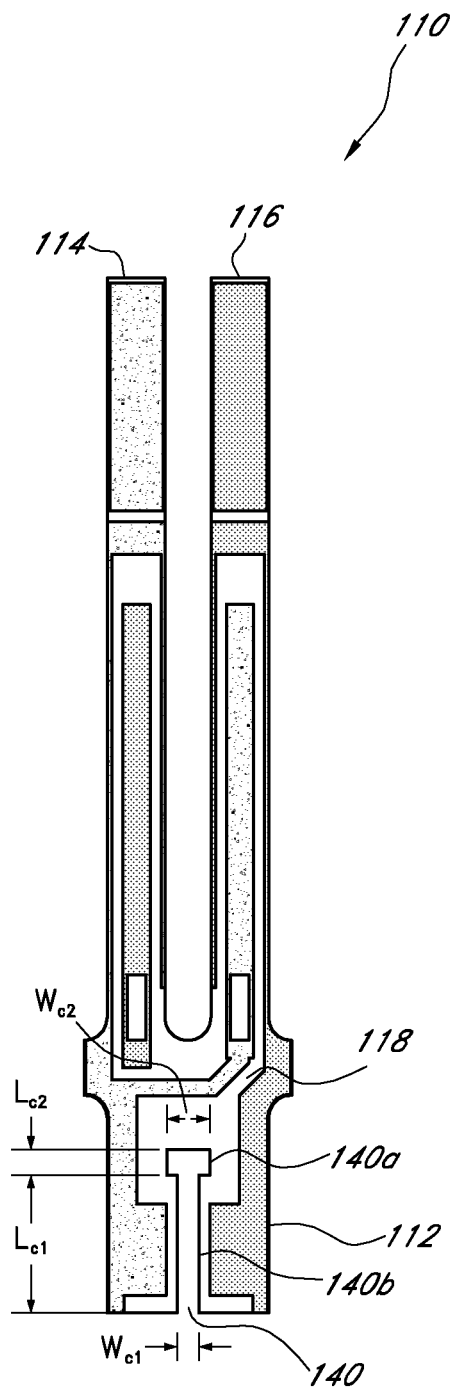
FIG. 3 is a top view of another embodiment of a piezoelectric resonator.

Additionally, in some embodiments, the channel 40' can define a circular, square, rectangular or any other suitable cross-sectional shape or combination of shapes. For example, FIG. 3 provides a non-limiting example of an alternatively shaped channel formed in the base of the resonator. FIG. 3 will be described in greater detail below.

Figure 2B:
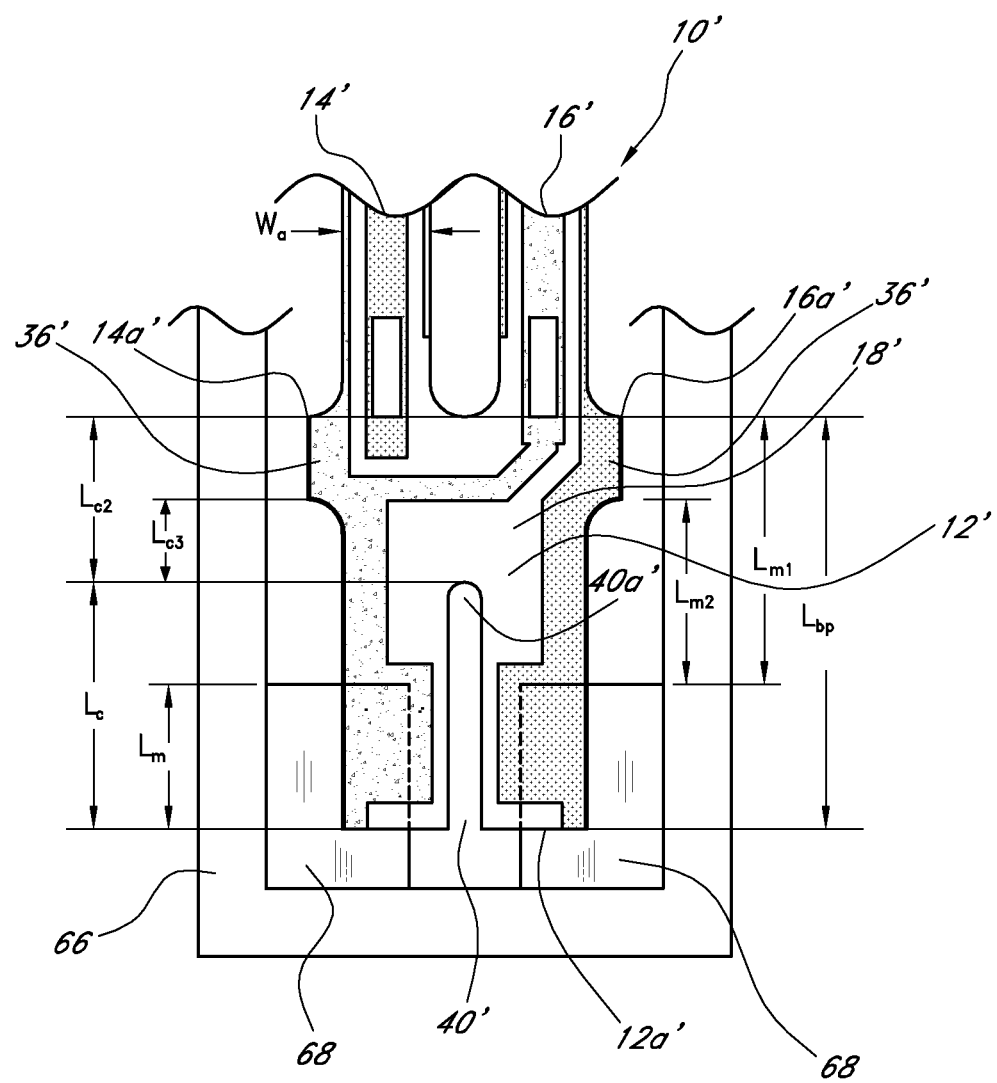
FIG. 2B is a top view of the embodiment of the piezoelectric resonator shown in FIG. 2A mounted in an exemplifying case.
Figures 2C, 2D:
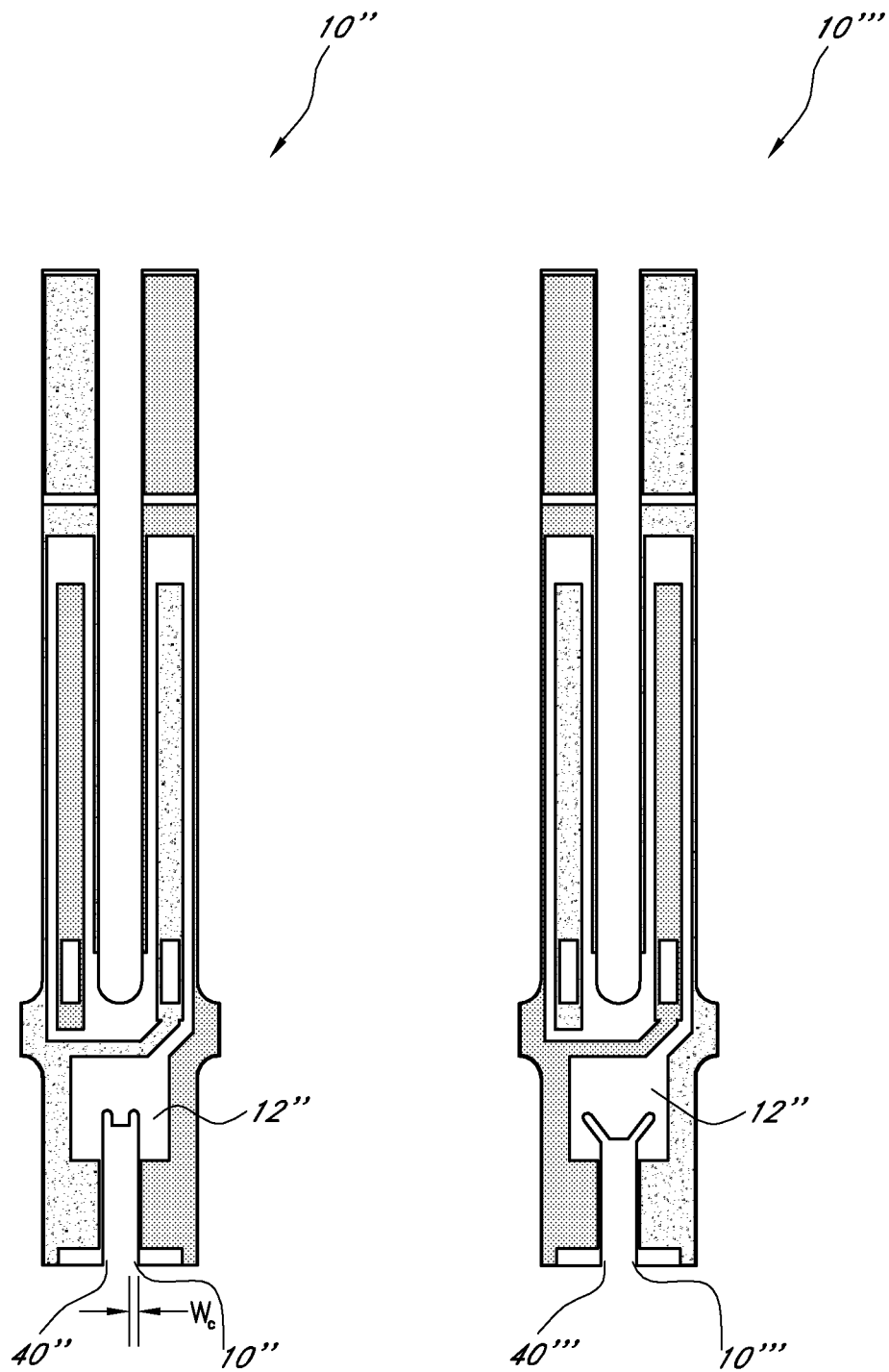
FIG. 2C is a top view of another embodiment of a piezoelectric resonator.
FIG. 2D is a top view of another embodiment of a piezoelectric resonator.

FIG. 2B is a top view of the embodiment of the piezoelectric resonator 10' shown in FIG. 2A mounted in an exemplifying case 66 (which can be a ceramic package) having mounting pads 68. As illustrated therein, the mounting length of the resonator 10 is essentially the length of the portion of each mounting pad 68 that overlaps the base 12' of the resonator 10, which is represented by Lm in FIG. 2B. In some embodiments, the mounting length Lm for the resonator should be sufficient to ensure a sufficient mounting area between the resonator and the case, so as to ensure sufficient mechanical strength in the bond between the resonator and the casing to withstand a threshold or predetermined magnitude of shock or other impact forces.

In some embodiments, in order to miniaturize the size of the resonator, the base 12' can be sized and configured so that the distance from the base 14a', 16a' of each of the arms 14', 16' to the pads 68 (represented by Lm1 in FIG. 2B) can be minimized. When the length Lm1 is minimized, the overall length Lbp of the base 12' of the resonator 10' can be reduced. However, in some embodiments, reducing the length Lm1 can reduce the quality factor Q of the resonator. Features and configurations such as, but not limited to, the vibration isolation arms 36' and the channel 40' illustrated in FIG. 2B can permit the length Lm1 to be reduced without a significant reduction in the quality factor Q of the resonator 10'. In some conventional resonators, the base 12' can be sized and configured so that the distance Lm1 is approximately equal to or greater than three times the width Wa of each of the arms 14', 16'. In some embodiments, the base 12' can be sized and configured so that Lm1 is approximately equal to or less than two times the width Wa of each of the arms 14', 16'.

In some embodiments, the resonator can be configured so as to maximize the difference between the distance from the pads 68 to each of the vibration isolation arms 36 (represented by Lm2 in FIG. 2B), which can result in an increase in the quality factor Q of the resonator. In some embodiments, this can be achieved by decreasing the width Wva of each of the vibration isolation arms 36 and positioning the vibration isolation arms 36 adjacent to each of the arms 14, 16. As is discussed above, in some embodiments, the width Wva of each of the vibration isolation arms 36 can be approximately 0.0025 in, or from approximately 0.001 in or less to approximately 0.010 in or more, or from approximately 0.002 in to approximately 0.005 in.

In some embodiments, the width Wva of the vibration isolation arms 36 can be approximately 15% of the of the length of the base 12 (represented by Lbp in FIG. 1F). In some embodiments, the width Wva of the vibration isolation arms 36 can be from approximately from approximately 10% or less to approximately 30% or more, or from approximately 15% to approximately 25% of the length of the base 12.

Typical mounting lengths Lm can vary between approximately 0.010 in. and approximately 0.020 in. However, the mounting length Lm of any of the resonators disclosed herein can be any length that ensures a sufficient bond between the resonator and the case, and is therefore not so limited. The resonators described herein can define any desired or suitable mounting length Lm within or outside of the above listed range, including without limitation a mounting length Lm from approximately 0.005 in or less to approximately 0.025 in or more. In some embodiments, decreasing the mounting length Lm can result in an increase in the quality factor of the resonator for a given length of the base Lbp.

In some embodiments, as in the illustrated embodiment, the length Lc of the channel 40' can be substantially greater than the mounting length Lm. In some embodiments, increasing the difference between the length Lc of the channel 40' and the mounting length Lm can reduce the amount of vibration leakage from the arms 14', 16' to the base 12' of the resonator 10' and, hence, increase the quality factor of the resonator 10'. In particular, in some embodiments, the length Lc of the channel 40' can be approximately 50% greater than the mounting length Lm. In some embodiments, the length Lc of the channel 40' can be approximately 0.015 in. However, the configuration of the channel 40' is not so limited. The resonator 10' can be configured with features having any suitable shape or size either within or outside of the above dimensional ranges. In some embodiments, the length Lc of the channel 40' can be from approximately 10% or less to approximately 100% or more, or from approximately 20% to approximately 50% greater than the mounting length Lm. Similarly, the length Lc of the channel 40' can be from approximately 0.005 in or less to approximately 0.022 in or more, or from approximately 0.010 in to approximately 0.018 in, or from approximately 0.013 in to approximately 0.016 in, or to or from any values within these ranges.

In some embodiments, the length of the channel 40' can be less than the length of the second base portion. In some embodiments, the length of the channel 40' can be greater than or equal to the length of the second base portion. Further, in some embodiments, the resonator can be configured so as to optimize the distance between the end of the channel 40' and the vibration isolation arms 36. For example, in some embodiments, the distance along the centerline of the resonator between the end of the channel 40' closest to the vibration isolation arms 36 and the vibration isolation arms 36 closest to the end of the channel 40' (represented by Lc3 in FIG. 2B) can be approximately 0.005 in, or from approximately 0.002 in or less to approximately 0.010 in or more.

With reference to FIG. 2B, the distance between the proximal ends 14a', 16a', respectively, of the arms 14', 16' and the distal portion of 40a' of the channel 40' is represented by Lc2. In some embodiments (not illustrated), the channel 40' can be formed so that the mounting distance Lm is greater than the distance Lc2 between the proximal ends 14a', 16a', respectively, of the arms 14', 16' and the distal portion of 40a' of the channel 40'. In particular, in some embodiments, the mounting distance Lm can be approximately 20% greater than distance Lc2. However, the configuration of the channel 40' is not so limited. The resonator 10' can be configured with features having any suitable shape or size either within or outside of the above dimensional ranges. In some embodiments, the mounting distance Lm can be between approximately 10% or less and approximately 40% or more, or between approximately 20% and approximately 30% greater than distance Lc2.

In some embodiments, a channel 40' having a length (represented by Lc in FIG. 2A) that is approximately 60% of the length Lbp of the base 12' can be formed in the base 12' of the resonator 10'. In some embodiments, the channel 40' can have a length Lc that is between approximately 45% and approximately 75%, or between approximately 55% and approximately 65%, or between approximately 58% and approximately 62% of the length Lbp of the base 12'. However, the resonator 10' is not so limited. The resonator 10' can be configured with features having any suitable shape or size either within or outside of the above dimensional ranges.

Additionally, in some embodiments, the channel 40' can have a width (represented by Wc in FIG. 2A) in the base 12' that is approximately 10% of the width (represented by Wb2 in FIG. 2A) of the base 12'. In some embodiments, the channel 40' can have a width Wc that is between approximately 5% and approximately 20%, or between approximately 8% and approximately 15%, or between approximately 5% and approximately 9% of the width Wb2 of the base 12'. However, the resonator 10' is not so limited. The resonator 10' can be configured with features having any suitable shape or size either within or outside of the above dimensional ranges.

The channel 40' can be, but is not required to be, formed at the approximate symmetrical centerline of the resonator 10'. Again, note that the etching anisotropy effect described above can also affect the shape and symmetry of the channel 40'. In some embodiments, the channel 40' can be formed in the base 12' at a position that is offset from the centerline of the base 12' to compensate for the etching anisotropy described above and so that the resonator can define a generally symmetrical cross-section along the length thereof.

FIG. 3 is a top view of another embodiment of a piezoelectric resonator 110. In some embodiments, the resonator 110 can comprise any other features, sizes, or other configurations of the resonator 10 described above, or of any other resonator described herein, in addition to or in the alternative with respect to the features or configurations described below. With reference to FIG. 3, a channel 140 can be formed in the base 112 from the first main surface 118 to the second main surface 120 of the resonator 110. In some embodiments, the channel 140 can reduce the amount of vibration leakage from the arms 114, 116 to the base 112 of the resonator 110. In some embodiments, the length of the base 112 (represented by Lbp in FIG. 1F) can be reduced and, hence, miniaturized, without decreasing the quality factor or increasing the crystal impedance of the resonator 110 by forming the channel 140 in the base of the resonator 110.

In some embodiments, as in the illustrated embodiment, resonator 110 is preferably configured so that the distal portion 140a of the channel 140 has a width (represented by Wc2 in FIG. 3) that is greater than the width (represented by Wc1 in FIG. 3) of the proximal portion 140b of the channel 140. As illustrated, in some embodiments, the distal portion 140a of the channel 140 can have rounded corners or can be otherwise configured to reduce or eliminate stress concentrations that may result during operation of the resonator 110 in the distal portion 140a of the channel 140. Additionally, in some embodiments, as in the illustrated embodiment, the resonator 110 is preferably configured so that the distal portion 140a of the channel 140 has a length (represented by Lc2 in FIG. 3) that is significantly smaller than the length (represented by Lc1 in FIG. 3) of the proximal portion 140b of the channel 140. In other words, in some embodiments, the portion 140a of the channel 140 that has an increased width can be shorter than the proximal portion 140b of the channel 140.

In some embodiments, forming a channel 140 having this geometry (i.e., forming a channel 140 with a portion of the channel 140 having a width Wc2 that is significantly larger than the width Wc1 over a discrete length Lc1 of the channel 140) can reduce the amount of vibration leakage from the arms 114, 116 to the base 112 of the resonator 110 and, hence, increase the quality factor of the resonator 110. In particular, in some embodiments, as in the illustrated embodiment, forming a channel 140 having a width Wc2 of the distal portion 140a of the channel 140 that is approximately double (i.e., approximately 100% larger than) the width Wc1 of the proximal portion 140b of the channel 140 can reduce the amount of vibration leakage from the arms 114, 116 to the base 112 of the resonator 110. Additionally, in some embodiments, though not so limited, the distal portion 140a of the channel 140 can have a width Wc2 that is between approximately 20% and approximately 150%, or between approximately 50% and approximately 120%, or between approximately 75% and approximately 100% larger than the width Wc1 of the channel 140. However, the resonator 110 is not so limited. The resonator 110 can be configured with features having any suitable shape or size either within or outside of the above dimensional ranges.

In some embodiments, as in the illustrated embodiment, the length (represented by Lc2 in FIG. 3) of the distal portion 140a of the channel 140 can be approximately 20% of the length (represented by Lc1 in FIG. 3) of the proximal portion 140b of the channel 140. Additionally, in some embodiments, though not so limited, the distal portion 140a of the channel 140 can have a length Lc2 that is between approximately 10% and approximately 30%, or between approximately 15% and approximately 25% of the length Lc1 of the proximal portion 140b of the channel 140. However, the resonator 110 is not so limited. The resonator 110 can be configured with features having any suitable shape or size either within or outside of the above dimensional ranges.

Figures 4, 5:
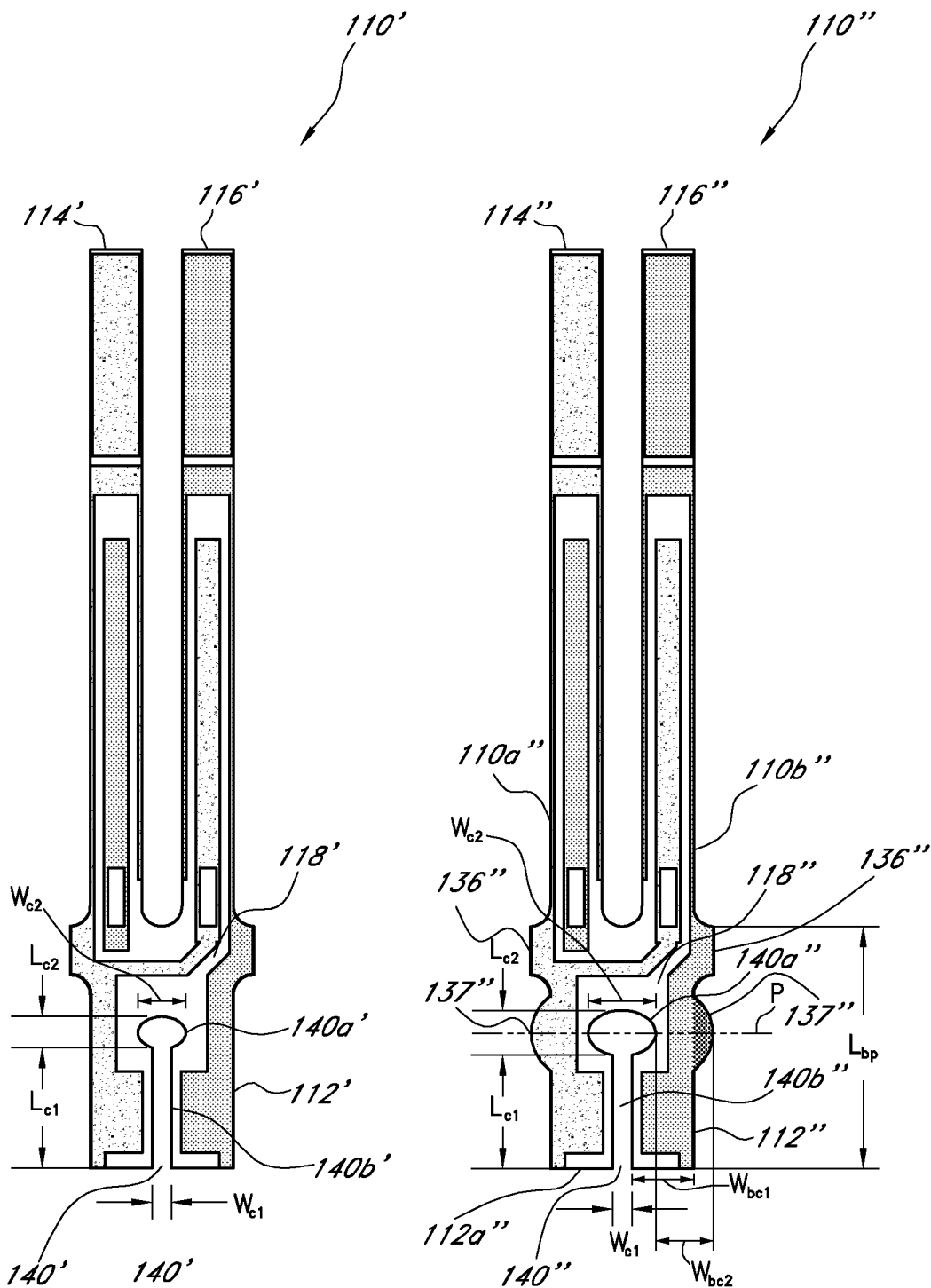
FIG. 4 is a top view of another embodiment of a piezoelectric resonator.
FIG. 5 is a top view of another embodiment of a piezoelectric resonator.

FIG. 4 is a top view of another embodiment of a piezoelectric resonator 110'. In some embodiments, the resonator 110' can comprise any other features, sizes, or other configurations of the resonator 10 or resonator 110 described above, or of any other resonator described herein, in addition to or in the alternative with respect to the features or configurations described below. With reference to FIG. 4, a channel 140' can be formed in the base 112' from the first main surface 118' to the second main surface 120' (not shown) of the resonator 110'. In some embodiments, the channel 140' can reduce the amount of vibration leakage from the arms 114', 116' to the base 112' of the resonator 110'. In some embodiments, the length of the base 112' (represented by Lbp in FIG. 1F) can be reduced and, hence, miniaturized, without decreasing the quality factor or increasing the crystal impedance of the resonator 110' by forming the channel 140' in the base of the resonator 110'.

In some embodiments, as in the illustrated embodiment, resonator 110' is preferably configured so that the distal portion 140$a$' of the channel 140' has a maximum width (represented by Wc2 in FIG. 4) that is significantly larger than the maximum width (represented by Wc1 in FIG. 4) of the proximal portion 140$b$' of the channel 140'. Additionally, with reference to FIG. 4, the distal end portion 140$a$' of the channel 140' can have an ovular, circular, or other similar cross-section generally free of sharp corners or edges that might otherwise result in stress concentrations in the base 112' of the resonator 110'. Forming a channel 140' having this size and geometry can reduce the amount of vibration leakage from the arms 114', 116' to the base 112' of the resonator 110'. In particular, in some embodiments, as in the illustrated embodiment, forming a channel 140' having a width Wc2 of the distal portion 140$a$' of the channel 140' that is approximately double the width Wc1 of the proximal portion 140$b$' of the channel 140' can reduce the amount of vibration leakage from the arms 114', 116' to the base 112' of the resonator 110'.

Additionally, in some embodiments, though not so limited, the distal portion 140$a$' of the channel 140' can have a width Wc2 that is between approximately 50% and approximately 150%, or between approximately 75% and approximately 125%, larger than the width Wc1 of the channel 140'. However, the resonator 110' is not so limited. The resonator 110' can be configured with features having any suitable shape or size either within or outside of the above dimensional ranges.

In some embodiments, as in the illustrated embodiment, the length (represented by Lc2 in FIG. 4) of the distal portion 140$a$' of the channel 140' can be approximately 20% of the length (represented by Lc1 in FIG. 4) of the proximal portion 140$b$' of the channel 140'. Additionally, in some embodiments, though not so limited, the distal portion 140$a$' of the channel 140' can have a length Lc2 that is between approximately 10% and approximately 30%, or between approximately 15% and approximately 25% of the length Lc1 of the proximal portion 140$b$' of the channel 140'. However, the resonator 110' is not so limited. The resonator 110' can be configured with features having any suitable shape or size either within or outside of the above dimensional ranges.

FIG. 5 is a top view of another embodiment of a piezoelectric resonator 110". In some embodiments, except as described below, the resonator 110" can comprise any other features, sizes, or other configurations of the resonator 110, 110, or 110' described above, or of any other resonator described herein, in addition to or in the alternative with respect to the features or configurations described below. With reference to FIG. 5, a channel 140" can be formed in the base 112" from the first main surface 118" to the second main surface 120" (not shown) of the resonator 110". In some embodiments, the channel 140" can reduce the amount of vibration leakage from the arms 114", 116" to the base 112" of the resonator 110". In some embodiments, the length of the base 112" (represented by Lbp in FIG. 5) can be reduced and, hence, miniaturized, without decreasing the quality factor or increasing the crystal impedance of the resonator 110" by forming the channel 140" in the base of the resonator 110".

In the illustrated embodiment, the distal portion 140$a$" of the channel 140" can have a generally ovular cross-sectional shape. However, the shape of the distal portion 140$a$" is not so limited. In some embodiments, the distal portion 140$a$" of the channel 140" (or the distal portion of any channel described herein) may define any desired or suitable cross-sectional shape, such as, but not limited to, a circular, triangular, square, rectangular, or polygonal shape.

In some embodiments, as in the illustrated embodiment, resonator 110" is preferably configured so that the distal portion 140$a$" of the channel 140" has a maximum width (represented by Wc2 in FIG. 5) that is significantly larger than the maximum width (represented by Wc1 in FIG. 5) of the proximal portion 140$b$" of the channel 140". Additionally, with reference to FIG. 5, the distal end portion 140$a$" of the channel 140" can have an ovular, circular, or other similar cross-section generally free of sharp corners or edges that might otherwise result in stress concentrations in the base 112" of the resonator 110". Forming a channel 140" having this size and geometry can reduce the amount of vibration leakage from the arms 114", 116" to the base 112" of the resonator 110" and, hence, increase the quality factor of the resonator 110". In particular, in some embodiments, as in the illustrated embodiment, forming a channel 140" having a width Wc2 of the distal portion 140$a$" of the channel 140" that is approximately double the width Wc1 of the proximal portion 140$b$" of the channel 140" can reduce the amount of vibration leakage from the arms 114", 116" to the base 112" of the resonator 110".

Additionally, in some embodiments, though not so limited, the distal portion 140$a$" of the channel 140" can have a width Wc2 that is between approximately 50% and approximately 150%, or between approximately 75% and approximately 125%, larger than the width Wc1 of the channel 140". However, the resonator 110" is not so limited. The resonator 110" can be configured with features having any suitable shape or size either within or outside of the above dimensional ranges.

In some embodiments, as in the illustrated embodiment, the length (represented by Lc2 in FIG. 5) of the distal portion 140$a$" of the channel 140" can be approximately 20% of the length (represented by Lc1 in FIG. 5) of the proximal portion 140$b$" of the channel 140". Additionally, in some embodiments, though not so limited, the distal portion 140$a$" of the channel 140" can have a length Lc2 that is between approximately 10% and approximately 30%, or between approximately 15% and approximately 25% of the length Lc1 of the proximal portion 140$b$" of the channel 140". However, the resonator 110" is not so limited. The resonator 110" can be configured with features having any suitable shape or size either within or outside of the above dimensional ranges.

Additionally, with reference to FIG. 5, in some embodiments, the resonator 110" can be formed so as to define and opposing pair of lateral protrusions 137" that can be positioned so as to be generally aligned with the distal end portion 140$a$" of the channel 140". In particular, in some embodiments, the lateral protrusions 137" can be positioned on the base 112" of the resonator 110" so that a plane "P" that passes through the approximate center of the distal end portion 140$a$" of the channel 140" also passes through the approximate center of the lateral protrusions 137". In some embodiments, as in the illustrated embodiment, the lateral protrusions 137" can define a generally curved geometry. In some embodiments, as in the illustrated embodiment, the lateral protrusions 137″ can define a geometry that is similar or approximately identical to the geometry of the vibration isolation arms 136″.

In some embodiments, the lateral protrusions 137″ can be sized and configured such that the width (represented by Wbc2 in FIG. 5) of the base 112″ between the distal end portion 140a″ and the adjacent side surface 110a″ or 110b″, respectively, is approximately equal to or greater than the width (represented by Wbc1 in FIG. 5) of the base 112″ between the proximal end portion 140b″ and the adjacent side surface 110a″ or 110b″.

By forming the resonator 110″ to have a width in the base 112″ adjacent to the distal end portion 140a″ of the channel 140″ that is approximately equal to or greater than the width in the base 112″ adjacent to the proximal end portion 140b″ of the channel 140', the cross-sectional area of the resonator 110″ in the region of the base 112″ adjacent to the distal end portion 140a″ of the channel 140″ can be approximately equal to or greater than the cross-sectional area in the base 112″ adjacent to the proximal end portion 140b″ of the channel 140″. Hence, in some embodiments, the structural stability of the base 112″ can be improved by forming the lateral protrusions 137″ adjacent to the distal end portion 140a″ of the channel 140″. In this configuration, the length of the base 112″ (represented by Lbp in FIG. 5) can be reduced and, hence, miniaturized, without decreasing the quality factor or increasing the crystal impedance of the resonator 110″.

In some embodiments, the width Wbc2 of the base 112″ between the distal end portion 140a″ and the adjacent side surface 110a″ or 110b″ can be greater than the width Wbc1 of the base 112″ between the proximal end portion 140b″ and the adjacent side surface 110a″ or 110b″ by approximately 10% or less. In some embodiments, the width Wbc2 of the base 112″ between the distal end portion 140a″ and the adjacent side surface 110a″ or 110b″ can be greater than the width Wbc1 of the base 112″ between the proximal end portion 140b″ and the adjacent side surface 110a″ or 110b″ by between approximately 10% and approximately 25%, or approximately 15% and approximately 20%.

Additionally, in some embodiments, with reference to FIG. 5, the total width of the base 112″ of the resonator 110″ along the plane P (i.e., the combined width Wbc2 of the base 112″ between the distal end portion 140a″ and the adjacent left side surface 110a″ and the width Wbc2 of the base 112″ between the distal end portion 140a″ and the adjacent right side surface 110b″) can be approximately equal to or greater than the aggregate width Wb2 along the base edge 112a″ of the resonator 110″. In this arrangement, the structural robustness of the base 112″ in the region adjacent to the distal end portion 140a″ of the channel 140″ can be further enhanced, while at the same time enhancing the base isolation benefits from the channel 140″.

Figure 6:
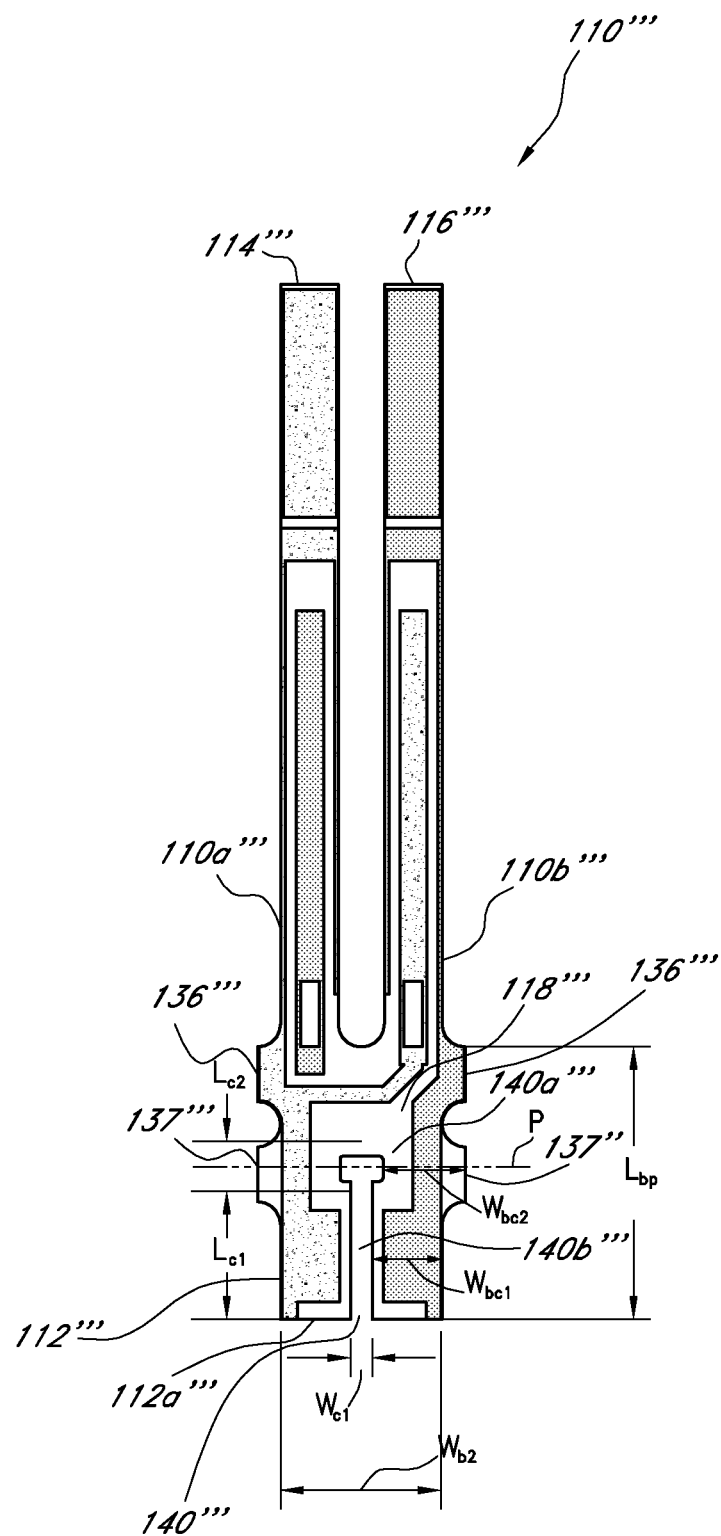
FIG. 6 is a top view of another embodiment of a piezoelectric resonator.

FIG. 6 is a top view of another embodiment of a piezoelectric resonator 110‴. In some embodiments, except as described below, the resonator 110‴ can comprise any other features, sizes, or other configurations of the resonators 10, 110, 110', or 110″ described above, or of any other resonator described herein, in addition to or in the alternative with respect to the features or configurations described below. With reference to FIG. 6, a channel 140‴ can be formed in the base 112‴ from the first main surface 118‴ to the second main surface 120‴ (not shown) of the resonator 110‴, having similar dimensions as compared to the channel 140″ of the resonator 110″ illustrated in FIG. 5.

In the illustrated embodiment, the distal portion 140a‴ of the channel 140‴ can have a generally rectangular cross-sectional shape. As illustrated, in some embodiments, the generally rectangular cross-sectional shape of the distal portion 140a‴ of the channel 140‴ can have rounded corners or can be otherwise configured to reduce or eliminate stress concentrations that may result during operation of the resonator 110‴ in the distal portion 140a‴ of the channel 140‴. However, the shape of the distal portion 140a‴ is not so limited. In some embodiments, the distal portion 140a‴ of the channel 140‴ (or the distal portion of any channel described herein) can define any desired or suitable cross-sectional shape, such as, but not limited to, a circular, triangular, square, rectangular, or polygonal shape.

In some embodiments, as in the illustrated embodiment, resonator 110‴ is preferably configured so that the distal portion 140a‴ of the channel 140‴ has a maximum width (represented by Wc2 in FIG. 6) that is significantly larger than the maximum width (represented by Wc1 in FIG. 6) of the proximal portion 140b‴ of the channel 140‴. Additionally, with reference to FIG. 6, the distal end portion 140a‴ of the channel 140‴ can have a generally rectangular (as shown), ovular, circular, or other similar cross-section. Forming a channel 140‴ having this size and geometry can reduce the amount of vibration leakage from the arms 114‴, 116‴ to the base 112‴ of the resonator 110‴ and, hence, increase the quality factor of the resonator 110‴.

In some embodiments, the resonator 110‴ can be formed so as to define a pair of lateral protrusions 137‴ that can be positioned so as to be generally aligned with the distal end portion 140a‴ of the channel 140‴. In particular, in some embodiments, the lateral protrusions 137‴ can be positioned on the base 112‴ of the resonator 110‴ so that a plane "P" that passes through the approximate center of the distal end portion 140a‴ of the channel 140‴ also passes through the approximate center of the lateral protrusions 137‴. In some embodiments, as in the illustrated embodiment, the lateral protrusions 137‴ can define a geometry that is similar or approximately identical to the geometry of the vibration isolation arms 136‴.

In some embodiments, the lateral protrusions 137‴ can be sized and configured such that the width (represented by Wbc2 in FIG. 6) of the base 112‴ between the distal end portion 140a‴ and the adjacent side surface 110a‴ or 110b‴, respectively, is approximately equal to or greater than the width (represented by Wbc1 in FIG. 6) of the base 112‴ between the proximal end portion 140b‴ and the adjacent side surface 110a‴ or 110b‴.

By maintaining a width in the base 112‴ adjacent to the distal end portion 140a‴ of the channel 140‴ to be approximately equal to or greater than the width in the base 112‴ adjacent to the proximal end portion 140b‴ of the channel 140‴, the cross-sectional area of the resonator 110‴ in the region of the base 112‴ adjacent to the distal end portion 140a‴ of the channel 140‴ will be approximately equal to or greater than the cross-sectional area in the base 112‴ adjacent to the proximal end portion 140b‴ of the channel 140‴. Hence, in some embodiments, the structural stability of the base 112‴ can be improved by forming the lateral protrusions 137‴ adjacent to the distal end portion 140a‴ of the channel 140‴. In this configuration, the length of the base 112‴ (represented by Lbp in FIG. 6) can be reduced and, hence, miniaturized, without decreasing the quality factor or increasing the crystal impedance of the resonator 110‴.

In some embodiments, the width Wbc2 of the base 112‴ between the distal end portion 140a‴ and the adjacent side surface 110a‴ or 110b‴ can be greater than the width Wbc1 of the base 112‴ between the proximal end portion 140b‴ and the adjacent side surface 110a‴ or 110b‴ by approximately 10% or less. In some embodiments, the width wbc2 of the base 112''' between the distal end portion 140a''' and the adjacent side surface 110a''' or 110b''' can be greater than the width Wbc1 of the base 112''' between the proximal end portion 140a''' and the adjacent side surface 110a''' or 110b''' by approximately 10% to approximately 25%, or from approximately 15% to approximately 20%.

Additionally, in some embodiments, with reference to FIG. 6, the total width of the base 112''' of the resonator 110''' along the plane P (i.e., the combined width Wbc2 of the base 112''' between the distal end portion 140a''' and the adjacent left side surface 110a''' and the width Wbc2 of the base 112''' between the distal end portion 140a''' and the adjacent right side surface 110b''') can be approximately equal to or greater than the width Wb2 along the base edge 112a''' of the resonator 110'''. In this arrangement, the structural robustness of the base 112''' in the region adjacent to the distal end portion 140a''' of the channel 140''' can be further enhanced, while at the same time enhancing the base isolation benefits from the channel 140'''.

Figure 7:
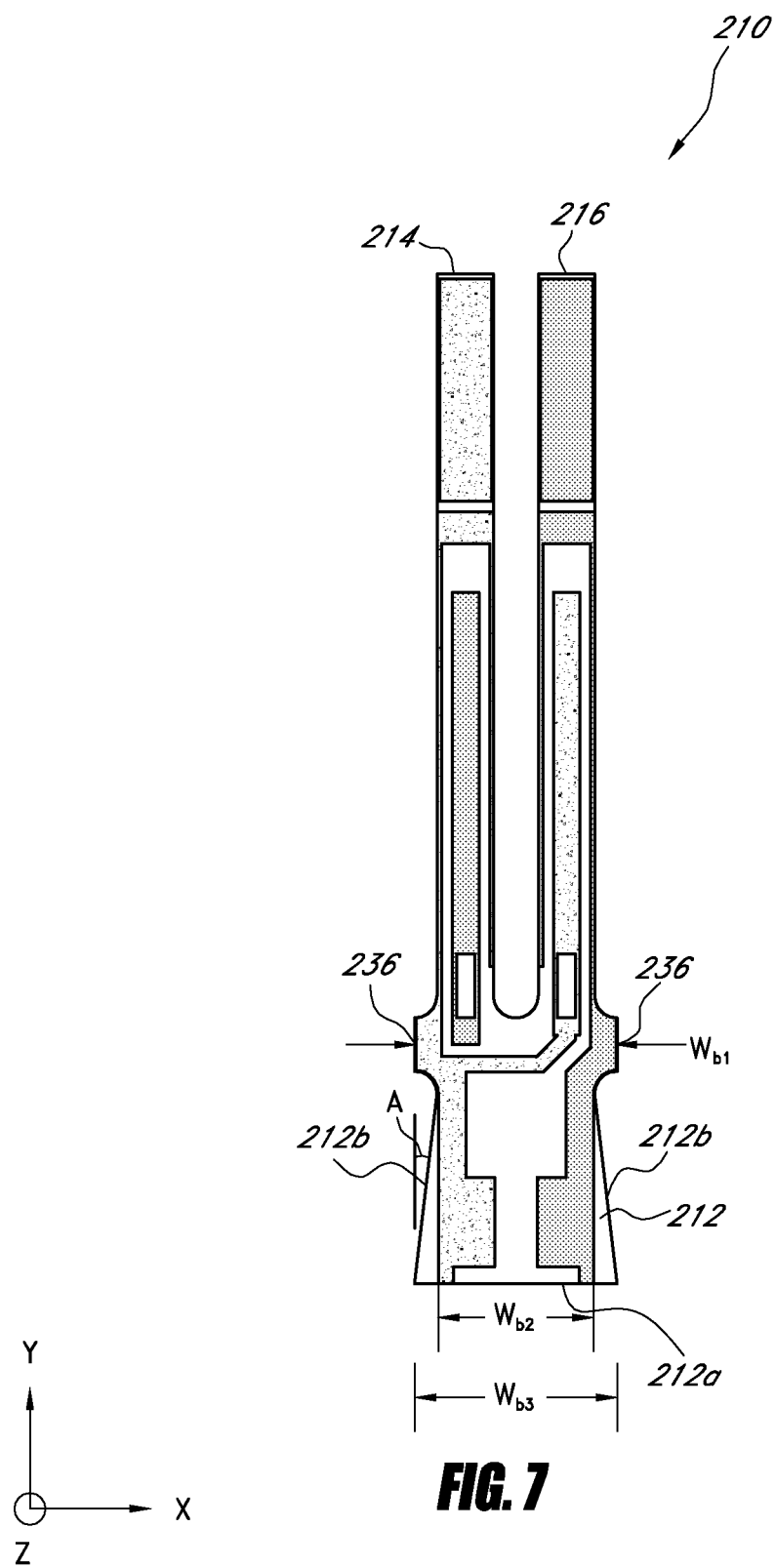
FIG. 7 is a top view of another embodiment of a piezoelectric resonator.

FIG. 7 is a top view of another embodiment of a piezoelectric resonator 210. In some embodiments, the resonator 210 can comprise any of the features, sizes, or other configurations of the resonator 10 described above, or of any other resonator described herein, in addition to or in the alternative with respect to the features or configurations described below.

With reference to FIG. 7, the base 212 of the resonator 210 can be formed so that at least a portion of one or more of the side surfaces 212b of the base 212 is tapered or angled or otherwise reduces in width from the base edge 212a toward the vibration isolation arms 236. In particular, with reference to FIG. 7, the base 212 of the resonator 210 can be formed such that the width (represented by Wb3 in FIG. 7) of the base 212 at the base edge 212a is greater than the width (represented by Wb2 in FIG. 7) of the base 212 approximately adjacent to the vibration isolation arms 236. The width Wb3 can be greater or less than the width (represented by Wb1 in FIG. 7) of the base 212 in the region of the vibration isolation arms 236.

In some embodiments, the increased width of the base 212 at the base edge 212a of the base 212 can increase the mounting surface area available by which to mount the resonator 210 to a case or other supporting structure, as illustrated in FIG. 2B. Additionally, in some embodiments, the increased width of the base 212 at the base edge 212a can increase the structural strength of the base 212 of the resonator 210 and, hence, increase the structural robustness of the resonator 210.

In some embodiments, as in the illustrated embodiment, each of the side surfaces 212b can define a generally planar flat surface. In some embodiments, the base 212 of the resonator 210 can be configured so that each of the side surfaces 212b defines an angle (represented by A in FIG. 7) that is approximately 10 degrees relative to a vertical plane, the vertical plane being parallel to the y-axis illustrated in FIG. 7. In some embodiments, base 212 of the resonator 210 can be configured so that each of the side surfaces 212b defines an angle A that is from approximately 5 degrees or less to approximately 25 degrees or more, or from approximately 10 degrees to approximately 20 degrees relative to plane A.

However, the configuration and shape of the base 212 is not so limited. In some embodiments, each of the side surfaces 212b can define a curved surface or any other suitably shaped surface, or can define a combination of two or more suitable shapes, and can comprise notches, channels, protrusions, splines, or any other desired or suitable shapes or features. In some embodiments, as in the illustrated embodiment, the base 212 of the resonator 210 can be configured such that the width Wb3 of the base 212 at the base edge 212a is greater than the width Wb2 of the base 212 by approximately 20%. In some embodiments, the base 212 of the resonator 210 can be configured such that the width Wb3 of the base 212 at the base edge 212a is greater than the width Wb2 of the base 212 by between approximately 5% or less and approximately 35% or more, or between approximately 10% and approximately 30%, or between approximately 15% and approximately 25%.

Figure 8:
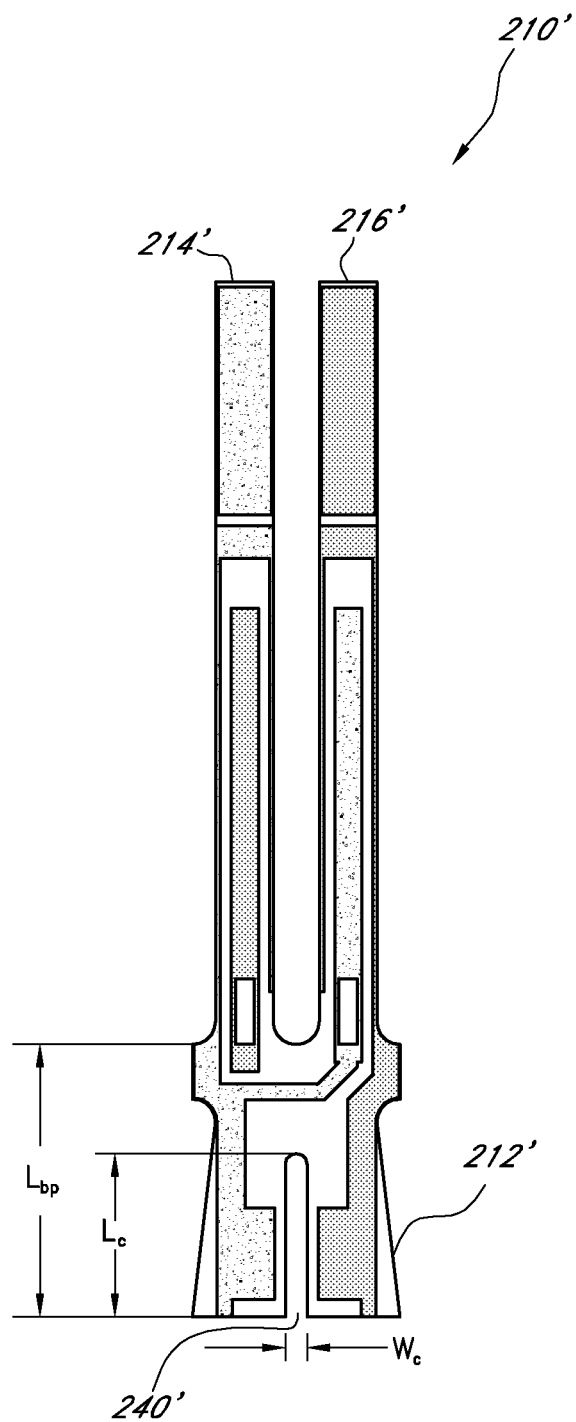
FIG. 8 is a top view of another embodiment of a piezoelectric resonator.

FIG. 8 is a top view of another embodiment of a piezoelectric resonator 210'. In some embodiments, the resonator 210' can comprise any other features, sizes, or other configurations of the resonator 210 described above, or of any other resonator described herein, in addition to or in the alternative with respect to the features or configurations described below. With reference to FIG. 8, a channel 240' can be formed in the base 212' from the first main surface 218' to the second main surface (not shown) of the resonator 210'. In some embodiments, the channel 240' can be configured to be the same or similar to any arrangements of any of the channels described above, including, but not limited to the channel 40'''. In some embodiments, the channel 240' can reduce the amount of vibration leakage from the arms 214', 216' to the base 212' of the resonator 210'. Thus, in some embodiments, the length of the base 212' (represented by Lbp in FIG. 8) can be reduced and, hence, miniaturized, without decreasing the quality factor or increasing the crystal impedance of the resonator 210' by forming the channel 240' in the base of the resonator 210' by forming the channel 240' in the base of the resonator 210'. In some embodiments, the resonator 210' can be configured to define more than one channel 240' formed in the base 212' of the resonator 210', arranged in parallel or otherwise.

In the illustrated embodiment, the channel 240' can comprise a generally semicircular end portion 240a' and a generally rectangular cross-section proximal portion 240b'. In some embodiments, as in the illustrated embodiment, the proximal portion 240b' of the channel 240' can be formed in the base 212' of the resonator 210' so to pass through the base edge 212a' of the resonator 210'. However, in some embodiments of the resonator 210' or any resonators disclosed herein, the base 212' of the resonator 210' can be formed so that the channel 240' does not penetrate through the base edge 212a' of the resonator 210' (not illustrated). In other words, in some embodiments, the channel 240' can be formed in the base 212' of the resonator 210' so as to form a completely enclosed geometry and such that the base edge 212a' is continuous.

Additionally, in some embodiments, the channel 240' can define a circular, square, rectangular or any other suitable cross-sectional shape or combination of shapes. For example, FIG. 3 (described above) provides a non-limiting example of an alternatively shaped channel formed in the base of the resonator.

In some embodiments, forming a channel 240' having a length (represented by Lc in FIG. 8) that is approximately 60% of the length Lbp of the base 212' can reduce the amount of vibration leakage from the arms 214', 216' to the base 212' of the resonator 210' and, hence, increase the quality factor of the resonator 210'. In some embodiments, the channel 240' can have a length Lc that is between approximately 40% and approximately 80%, or between approximately 55% and approximately 65%, or between approximately 58% and approximately 62% of the length Lbp of the base 212'. However, the resonator 210' is not so limited. The resonator 210' can be configured with features having any suitable shape or size either within or outside of the above dimensional ranges.

Additionally, in some embodiments, the channel 240' can have a width (represented by Wc in FIG. 8) in the base 212' that is approximately 7% of the width (represented by Wb2 in FIG. 7) of the base 212'. In some embodiments, the channel 240' can have a width Wc that is between approximately 2% and approximately 12%, or between approximately 4% and approximately 10%, or between approximately 5% and approximately 9% of the width Wb2 of the base 212'. However, the resonator 210' is not so limited. The resonator 210' can be configured with features having any suitable shape or size either within or outside of the above dimensional ranges.

The channel 240' can be, but is not required to be, formed at the approximate symmetrical centerline of the resonator 210'. Again, note that the etching anisotropy effect described above can also affect the shape and symmetry of the channel 240'. In some embodiments, the channel 240' can be formed in the base 212' at a position that is offset from the centerline of the base 212' to compensate for the etching anisotropy described above and so that the resonator can define a generally symmetrical cross-section along the length thereof.

Figure 9:
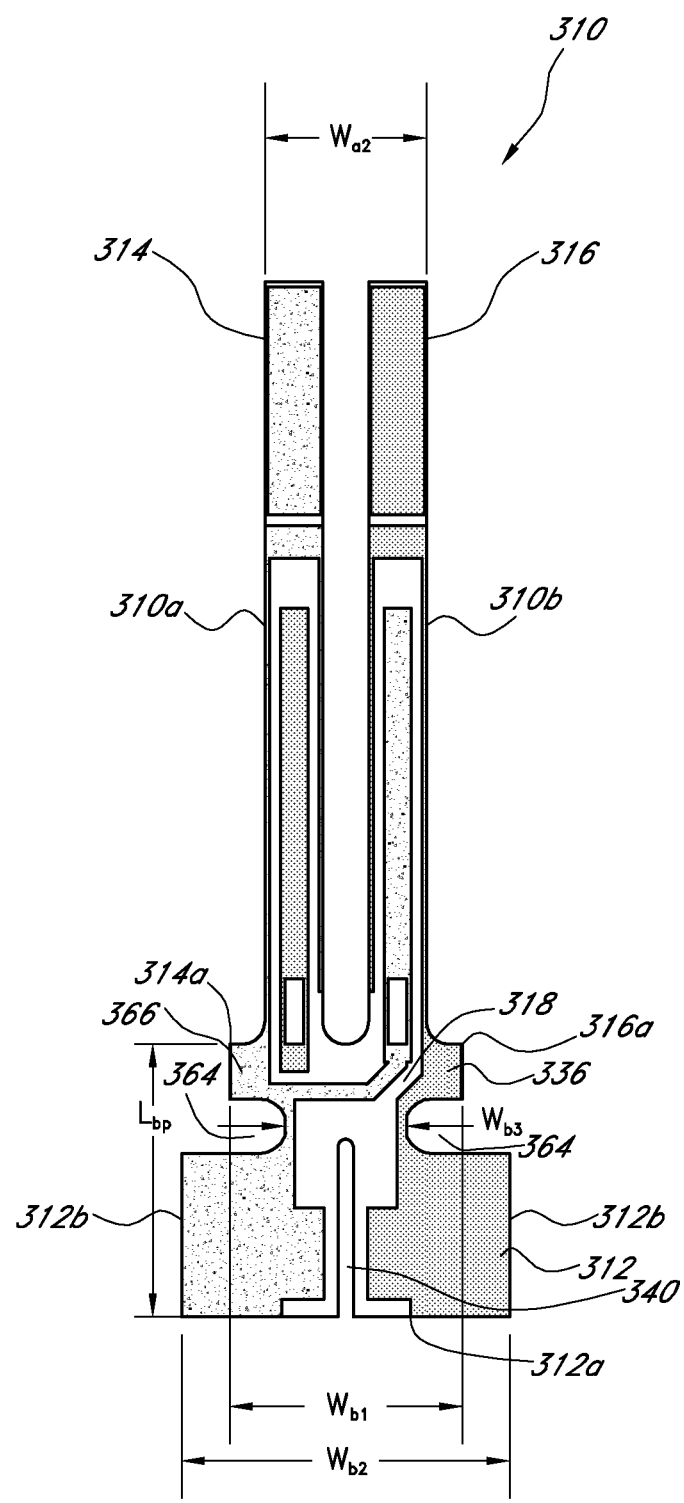
FIG. 9 is a top view of another embodiment of a piezoelectric resonator.

FIG. 9 is a top view of another embodiment of a piezoelectric resonator 310. In some embodiments, the resonator 310 can comprise any other features, sizes, or other configurations of the resonator 210 described above, or of any other resonator described herein, in addition to or in the alternative with respect to the features or configurations described below.

With reference to FIG. 9, a channel 340 can be formed in the base 312 from the first main surface 318 to the second main surface (not shown) of the resonator 310. In some embodiments, the channel 340 can be configured to be the same or similar to any arrangements of any of the channels described above, including, but not limited to the channel 40". In some embodiments, the channel 340 can reduce the amount of vibration leakage from the arms 314, 316 to the base 312 of the resonator 310. Thus, in some embodiments, the length of the base 312 (represented by Lbp in FIG. 9) can be reduced and, hence, miniaturized, without decreasing the quality factor or increasing the crystal impedance of the resonator 310 by forming the channel 340 in the base of the resonator 310 by forming the channel 340 in the base of the resonator 310. In some embodiments, the resonator 310 can be configured to define more than one channel 340 formed in the base 312 of the resonator 310, arranged in parallel or otherwise.

Additionally, with reference to FIG. 9, one or more vibration isolation arms 336 can be formed on each side surface 312a, 312b of the base 312 of the resonator 310 to reduce the amount of vibration leakage from the arms 314, 316 to the base 312. In some embodiments, the resonator 310 can be configured so that the vibration isolation arms 336 project laterally (i.e., in the positive x and negative x-directions) from the side surfaces 310a, 310b of the base 312 of the resonator 310. The vibration isolation arms 336 can be positioned adjacent to the proximal ends 314a, 316a of the arms 314, 316, or can be positioned at any location along the side surfaces 310a, 310b between the proximal ends 314a, 316a of the arms 314, 316 and the base edge 312a of the base 312. Additionally, in some embodiments, the vibration isolation arms 336 can define any of the sizes or configurations described above in conjunction with any of the other resonators.

In some embodiments, as in the illustrated embodiment, the vibration isolation arms 336 can be sized and configured so that the width (represented by Wb2 in FIG. 9) of the base 312 in the region of the base 312 adjacent to the base edge 312a of the base 312 is greater than the width (represented by Wb1 in FIG. 9) of the base 312 in the region of the vibration isolation arms 336. In some embodiments, the increased width Wb2 of the base 312 can increase the mounting area and stability of the base 312 of the resonator 310.

In some embodiments (not shown), the width Wb1 can be greater than the width (represented by Wa2 in FIG. 9) from the side surface 310a of the first arm 314 to the side surface 310b of the second arm 316. In some embodiments, the increased width Wb1 created by the vibration isolation arms 336 relative to the width (represented by Wa2 in FIG. 9) of the arms 314, 316 can reduce the amount of vibration leakage from the arms 314, 316 to the base 312 of the resonator and, hence, increase the quality factor of the resonator.

Additionally, with reference to FIG. 9, in some embodiments, one or more notches 364 can be formed in each of the side surfaces 312a, 312b of the base 312 to reduce the amount of vibration leakage from the arms 314, 316 to the base 312. In some embodiments, the resonator 310 can be configured so that the notches 364 are formed in the lateral direction (i.e., in the positive x and negative x-directions) in the side surfaces 310a, 310b of the base 312 of the resonator 310. The notches 364 can be positioned adjacent to the vibration isolation arms 336 or can be positioned at any location along the side surfaces 310a, 310b between the vibration isolation arms 336 and the base edge 312a of the base 312. Additionally, as illustrated, the notches 364 can define a generally rectangular shape with rounded internal corners. However, the geometry of the notches 364 is not so limited. In some embodiments, the notches 364 can define any suitable size or geometry including, but not limited to, generally curved, semicircular, triangular, or other desired shapes.

In some embodiments, the notches 364 can be sized and configured so that the width (represented by Wb3 in FIG. 9) of the base 312 in the region of the notches 364 is less than the width (represented by Wa2 in FIG. 9) from the side surface 310a of the first arm 314 to the side surface 310b of the second arm 316. In some embodiments, the decreased width created by the notches 364 can reduce the amount of vibration leakage from the arms 314, 316 to the base 312 of the resonator and, hence, increase the quality factor of the resonator.

Figure 10:
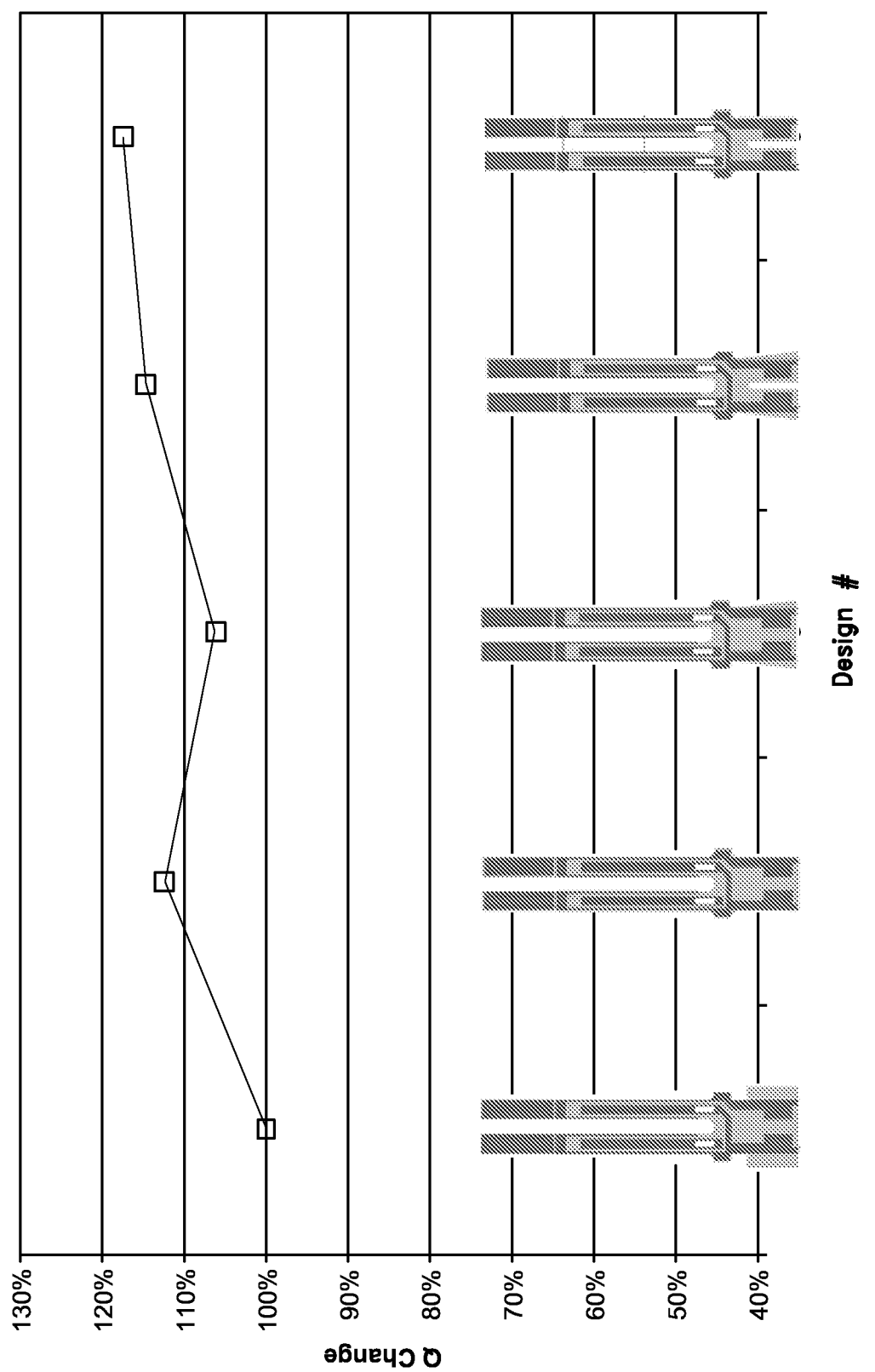
FIG. 10 is a graph of experimental data showing relative mean values of the quality factor Q for five different resonator embodiments.

FIG. 10 is a graph of experimental data showing the relative mean values of the quality factor Q for five different resonator embodiments (i.e., Design Nos. 1-5). The values shown in FIG. 10 for each of Design Nos. 1-5 are mean Q values of the data collected for a hermetically sealed ceramic package having an approximate size of 3.2 mm×1.5 mm. The mean Q values shown in FIG. 10 are based on particular testing conditions, resonator configurations, and package configurations. Q values can vary depending on the testing conditions and the actual configuration of the resonator and the case or package.

Design No. 1 is used as the reference point for the data comparison of FIG. 10. As illustrated, Design No. 1 has a pair of opposing notches formed in the base. Design Nos. 2-5 have features that are novel and disclosed herein. As illustrated in FIG. 10, Design No. 2 has a mean Q value that is approximately 12% higher than the Q value for Design No. 1. Similarly, Design No. 3 has a mean Q value that is approximately 6% higher than the Q value for Design No. 1. Design No. 4 has a mean Q value that is approximately 14% higher than the Q value for Design No. 1. Finally, Design No. 5 has a mean Q value that is approximately 18% higher than the Q value for Design No. 1.

Therefore, as shown in FIG. 10, Design Nos. 2 and 3 exhibited improved values for quality factor Q as compared to Design No. 1. By adding a channel in the base, Design Nos. 4 and 5 exhibited further improved values for the quality factor Q as compared to Design No. 1. Additionally, based on the experimental data gathered, other Designs also exhibited a higher level of repeatability than Design No. 1.

Any of the embodiments of the resonators described herein can have any of the features, dimensions, or other details, or any combination of the features, dimensions, or other details, of any other embodiment of the resonators described herein. Further, in some embodiments, any of the piezoelectric resonators described herein can be formed by processing piezoelectric quartz wafer in accordance with typical manufacturing processes. For example, in some embodiments, the outer shape of the resonator, the grooves, vibration isolation arms, through holes, channels, notches, and/or other features can be formed using photolithography and wet etching techniques commonly used in the field. The above-described electrodes can be formed from one or more thin film layers of gold, chromium, or any other suitable material. In some embodiments, the thickness of the thin film layer or layers comprising the electrodes can be approximately 0.2 µm. In some embodiments, the electrodes can be formed of a thin film layer of gold overlaying a thin-film layer of chromium. To form the electrode layers, the above-mentioned thin film can be formed on the entire surface of the piezoelectric resonator using, for example, sputtering, evaporation, or other deposition techniques. Thereafter, a resist film can be formed on portions of the piezoelectric resonator where the electrode layer is desired by a typical photolithographic technique, followed by an etching process to remove the undesired portions of the thin-film (i.e. the portions of the thin-film not covered with the resist).

Any of the resonators described herein can be hermetically sealed within a ceramic package or case, such as the case 66 described in conjunction with the resonator 10' described above in FIG. 2B. The figures described above illustrate various embodiments of resonators at the stage before the resonators are mounted in a typical ceramic package.

While the above detailed description has shown, described, and pointed out novel features as applied to various embodiments, it will be understood that various omissions, substitutions, and changes in the form and details of the device or process illustrated may be made without departing from the spirit of the disclosure. Additionally, the various features and processes disclosed herein may be used independently of one another, or may be combined in various ways. All possible combinations and subcombinations are intended to fall within the scope of this disclosure.

As will be recognized, certain embodiments described herein may be embodied within a form that does not provide all of the features and benefits set forth herein, as some features may be used or practiced separately from others. The scope of the inventions is indicated by the appended claims rather than by the foregoing description. All changes which come within the meaning and range of equivalency of the claims are to be embraced within their scope.

What is claimed is:

1. A piezoelectric resonator comprising:
   a base extending from a base edge to a first end portion and defining only a first base portion and a second base portion, wherein the first base portion is adjacent to the first end portion and the second base portion is adjacent to the base edge;
   a first and a second vibrating arm projecting from the first end portion of the base;
   a first vibration isolation arm projecting from a first lateral side of the first portion of the base, and a second vibration isolation arm projecting from a second lateral side of the first portion of the base so as to be collinear with the first vibration isolation arm, the second lateral side being opposite to the first lateral side, and the first and second vibration isolation arms being approximately perpendicular to the first and second vibrating arms;
   a generally planar first main surface and a generally planar second main surface defined by the base and the first and second vibrating arms, the first main surface being generally parallel to the second main surface; and
   at least one groove formed in at least one of the first and second main surfaces of each of the first and second vibrating arms;
   an opening formed in each of the first and second vibrating arms, the opening extending from the first main surface to the second main surface of the first and second vibrating arms, the opening being configured to conduct an electrical current between the first and second main surfaces of the resonator;
   a first mounting portion having a first electrode area adjacent to the first lateral side of the base;
   a second mounting portion having a second electrode area adjacent to the second lateral side of the base;
   a channel formed in at least a portion of the second base portion of the resonator and positioned between the first mounting portion and the second mounting portion of the base, the channel extending from the base edge toward the first base portion of the resonator and being configured to provide a free space between the first electrode area of the first mounting portion and the second electrode area of the second mounting portion so as to prevent or reduce the likelihood of a short circuit between the first electrode area of the first mounting portion and the second electrode area of the second mounting portion; and
   a case;
   wherein:
      the first mounting portion having the first electrode area is configured to mount to a first mounting pad of the case and to provide a first electrically conductive connection to the case;
      the second mounting portion having the second electrode area is configured to mount to a second mounting pad of the case and to provide a second electrically conductive connection to the case;
      the first base portion is closer to the vibrating arms than the second base portion;
      the first and second vibration isolation arms are sized and configured such that a width of the first base portion, including the width of the first and second vibration isolation arms, is greater than a width of any portion of the second base portion; and
      the channel is longer in a direction measured from the base edge toward the first base portion than a length of the first mounting portion and a length of the second mounting portion.

2. The resonator of claim 1, wherein the first and second vibration isolation arms are sized and configured such that a width of the first base portion is from approximately 20% to approximately 40% greater than a width of any portion of the second base portion.

3. The resonator of claim 1, wherein a length of the channel from the base edge toward the first base portion of the resonator is less than a distance from the base edge to either of the first and second vibration isolation arms in a direction parallel to the longitudinal direction of the first and second vibrating arms.

4. A piezoelectric resonator comprising:
   a base comprising a first base portion and a second base portion;

a first vibrating arm and a second vibrating arm projecting from the base;

a generally planar first main surface and a generally planar second main surface defined by the base and the first and second vibrating arms, the first main surface being generally parallel to the second main surface;

at least one groove formed in at least one of the first and second main surfaces of each of the first and second vibrating arms;

a first vibration isolation arm and a second vibration isolation arm projecting from the base;

a channel formed in at least a center portion of the second base portion of the base, the channel extending from a base edge of the second base portion of the resonator toward the first base portion of the resonator;

a first mounting portion and a second mounting portion located on the second base portion of the base; and a case supporting the resonator, the resonator being attached to the case at the first mounting portion and the second mounting portion;

wherein:

the first and second vibration isolation arms project from the base in a direction that is approximately perpendicular to a direction that the first and second vibrating arms project from the base;

the first vibration isolation arm projects from a portion of the base that is adjacent to the first vibrating arm;

the second vibration isolation arm projects from a portion of the base that is adjacent to the second vibrating arm;

the first and second vibration isolation arms are positioned closer to the first and second vibrating arms than to the base edge of the second base portion of the resonator;

the channel is positioned between the first mounting portion and the second mounting portion and is longer in a direction measured from the base edge toward the first base portion than a length of the first mounting portion and the second mounting portion from the base edge toward the first base portion; and the channel defines a free space in the base of the resonator between the first mounting portion and the second mounting portion after the resonator has been assembled in the case to prevent an electrical short between the first mounting portion and the second mounting portion.

5. The resonator of claim 4, wherein the first and second vibrating arms and the first and second vibration isolation arms project from the first base portion of the base.

6. The resonator of claim 4, wherein the base comprises only the first base portion and the second base portion, and the first and second vibration isolation arms are sized and configured such that a width of the first base portion is greater than a width of any portion of the second base portion.

7. The resonator of claim 4, wherein the first and second vibration isolation arms are sized and configured such that a width of the first base portion is approximately 30% greater than a width of any portion of the second base portion.

8. The resonator of claim 4, wherein the first and second vibration isolation arms are sized and configured such that a width of the first base portion is from approximately 20% to approximately 40% greater than a width of any portion of the second base portion.

9. The resonator of claim 4, wherein the second base portion has a uniform width along the entire length of the second base portion.

10. The resonator of claim 4, wherein the second base portion tapers along the length thereof.

11. The resonator of claim 4, wherein the first and second vibration isolation arms project from the base in mutually opposing directions and are collinear.

12. The resonator of claim 4, further comprising an opening formed in each of the first and second vibrating arms, the opening extending from the first main surface to the second main surface of at least one of the first and second vibrating arms.

13. The resonator of claim 12, wherein an electrode is disposed on a surface of the opening to conduct an electrical current between the first and second main surfaces of the resonator.

14. The resonator of claim 4, wherein a longitudinal length of the channel is less than a longitudinal length of the second base portion.

15. The resonator of claim 4, further comprising an electrode disposed on the at least one groove formed in at least one of the first and second main surfaces of each of the first and second vibrating arms.

16. The resonator of claim 4, further comprising an opening formed in at least one of the first and second vibrating arms adjacent to the at least one groove, the opening extending from the first main surface to the second main surface.

17. The resonator of claim 4, comprising two generally parallel grooves formed in at least one of the first and second main surfaces of each of the first and second vibrating arms.

18. The resonator of claim 4, wherein the first vibrating arm is substantially parallel to the second vibrating arm.

19. The resonator of claim 4, wherein a length of the channel from the base edge toward the first base portion of the resonator is less than a distance from the base edge to either of the first and second vibration isolation arms in a direction parallel to the longitudinal direction of the first and second vibrating arms.

20. A piezoelectric resonator comprising:

a base defining a first end portion and a base edge that is generally parallel to the first end portion, a first base portion and a second base portion, the first base portion being defined as the portion of the base extending from the first end portion to the second base portion, and the second base portion being defined as the portion of the base extending from the first base portion to the base edge;

a first vibrating arm and a second vibrating arm projecting from the first end portion of the base;

a generally planar first main surface and a generally planar second main surface defined by the base and the first and second vibrating arms, the first main surface being generally parallel to the second main surface;

at least one groove formed in at least one of the first and second main surfaces of each of the first and second vibrating arms;

a first vibration isolation arm and a second vibration isolation arm projecting from the base;

a channel formed in at least a portion of the second base portion of the resonator, the channel extending from the base edge toward the first base portion of the resonator; and an opening formed in each of the first and second vibrating arms, the opening extending from the first main surface to the second main surface of at least one of the first and second vibrating arms, the opening being configured to conduct an electrical current between the first and second main surfaces of the resonator;

wherein:

the base is sized and configured such that a width of the first base portion, measured in a direction transverse to a longitudinal direction of the vibrating arms, from a distal end of the first vibration isolation arm to a distal end of the second vibration isolation arm is from approximately 20% to approximately 40% greater than a width of any portion of the second base portion; and a width of each of the first and second vibration isolation arms in a direction parallel to the longitudinal direction of the vibrating arms is from approximately 10% to approximately 30% of a length of the base in the direction parallel to the longitudinal direction of the vibrating arms.

21. The resonator of claim 20, wherein an electrode is disposed on a surface of each opening to conduct an electrical current between the first and second main surfaces of the resonator.

22. The resonator of claim 20, comprising two generally parallel grooves formed in at least one of the first and second main surfaces of each of the first and second vibrating arms.

23. The resonator of claim 20, wherein a length of the channel from the base edge toward the first base portion of the resonator is less than a distance from the base edge to either of the first and second vibration isolation arms in a direction parallel to the longitudinal direction of the vibrating arms.

* * * * *

UNITED STATES PATENT AND TRADEMARK OFFICE
CERTIFICATE OF CORRECTION

PATENT NO. : 8,446,079 B2
APPLICATION NO. : 12/471084
DATED : May 21, 2013
INVENTOR(S) : Fang et al.

Page 1 of 1

It is certified that error appears in the above-identified patent and that said Letters Patent is hereby corrected as shown below:

In the Specifications

Column 9, line 39, Change "2.768 kHz" to --32.768 kHz--.

Column 15, line 10, Change "resonator 10'" to --resonator 10"--.

Column 19, line 56, Change "resonator 110" to --resonator 10--.

Signed and Sealed this
Seventh Day of January, 2014

Margaret A. Focarino
*Commissioner for Patents of the United States Patent and Trademark Office*